US012763153B2

(12) United States Patent
Toops et al.

(10) Patent No.: US 12,763,153 B2
(45) Date of Patent: Oct. 13, 2026

(54) MEMORY ARRAY AND REFERENCE CURRENT CIRCUIT

(71) Applicant: TEXAS INSTRUMENTS INCORPORATED, Dallas, TX (US)

(72) Inventors: David Toops, Dallas, TX (US); Yunchen Qiu, Plano, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 59 days.

(21) Appl. No.: 18/790,555

(22) Filed: Jul. 31, 2024

(65) Prior Publication Data

US 2026/0038605 A1 Feb. 5, 2026

(51) Int. Cl.

| | |
|---|---|
| ***G11C 16/30*** | (2006.01) |
| ***G11C 11/412*** | (2006.01) |
| ***G11C 14/00*** | (2006.01) |
| ***G11C 16/10*** | (2006.01) |
| ***G11C 16/26*** | (2006.01) |
| ***G11C 16/28*** | (2006.01) |

(52) U.S. Cl.

CPC ............ *G11C 16/30* (2013.01); *G11C 11/412* (2013.01); *G11C 14/0063* (2013.01); *G11C 16/10* (2013.01); *G11C 16/26* (2013.01); *G11C 16/28* (2013.01)

(58) Field of Classification Search

CPC ... G11C 16/30; G11C 11/412; G11C 14/0063; G11C 16/10; G11C 16/26; G11C 16/28

USPC .................................................... 365/185.21

See application file for complete search history.

(56) References Cited

U.S. PATENT DOCUMENTS

2005/0122831 A1* 6/2005 Roohparvar ..... G11C 29/50004 365/189.11
2019/0287605 A1* 9/2019 Kim .................... G11C 11/4097

* cited by examiner

*Primary Examiner* — Amir Zarabian
*Assistant Examiner* — Daniel John King
(74) *Attorney, Agent, or Firm* — Andrew R. Ralston; Charles F. Koch

(57) ABSTRACT

A circuit includes a memory array including memory bit cells arranged in rows and columns. A row includes differential reference bit cells and single-ended bit cells, and the reference bit cells include a first set configured to store a first binary value and a second set configured to store a second binary value different from the first binary value. The circuit also includes a control module configured to generate a first reference current and to select the given row for a read operation. The circuit additionally includes an input/output module configured to compare a sensed current of a respective single-ended bit cell of the single-ended bit cells for the read operation to a second reference current. The second reference current is based on the first reference current and respective currents of the first set of reference bit cells and the second set of reference bit cells.

21 Claims, 15 Drawing Sheets

MEMORY ARRAY AND REFERENCE CURRENT CIRCUIT

TECHNICAL FIELD

This description relates to a memory array and a circuit for generating reference current(s) for the memory array.

BACKGROUND

Electrically erasable programmable read-only memory (EEPROM) is a type of non-volatile memory (NVM) that uses an array of floating-gate transistors as memory. A floating-gate transistor is a type of metal-oxide-semiconductor field-effect transistor (MOSFET) where the gate is electrically isolated from inputs that are only capacitively coupled to it, allowing the charge contained on the floating gate to remain unchanged for long periods of time. EEPROM is used in a variety of applications for storing relatively small quantities of data that generally has a smaller erase block and/or longer lifetime than flash memory.

SUMMARY

A first example relates to a circuit. The circuit includes a memory array including memory bit cells arranged in rows and columns. A given row of the rows includes reference bit cells and single-ended bit cells, the reference bit cells being differential bit cells. The reference bit cells include a first set of reference bit cells configured to store a first binary value and a second set of reference bit cells configured to store a second binary value that is different from the first binary value. The circuit also includes a control module configured to generate a first reference current and to select the given row for a read operation. The circuit additionally includes an input/output module configured to compare a sensed current of a respective single-ended bit cell of the single-ended bit cells for the read operation to a second reference current. The second reference current is based on the first reference current and respective currents of the first set of reference bit cells and the second set of reference bit cells.

A second example relates to an integrated circuit (IC). The IC includes a memory array including memory bit cells arranged in rows and columns. A given row of the rows includes differential reference bit cells and single-ended bit cells. The differential bit cells of the given row have a first input, and the single-ended bit cells of the given row have a second input. The IC additionally includes a set of wordline drivers. A given wordline driver of the set of wordline drivers has an output coupled to the first input and to the second input. The IC further includes a control circuit including a row/column decoder having first control outputs. Each of the first control outputs are coupled to a respective wordline driver of the set of wordline drivers. The IC also includes first differential sense amplifiers. Outputs of a given differential reference bit cell of the differential reference bit cells are coupled to inputs of a given differential sense amplifier of the first differential sense amplifiers. Additionally, the IC includes second differential sense amplifiers. An output of a given single-ended bit cell of the single-ended bit cells is coupled to an amplifier input of a given differential sense amplifier of the second differential sense amplifiers.

A third example relates to a method of forming a circuit. The method includes forming a memory array including memory bit cells arranged in rows and columns. A given row of the rows includes reference bit cells and single-ended bit cells. The reference bit cells are differential bit cells, and the reference bit cells include a first set of reference bit cells configured to store a first binary value and a second set of reference bit cells configured to store a second binary value that is different from the first binary value. The method additionally includes forming a control module configured to generate a first reference current and to select the given row for a read operation. The method also includes forming an input/output module configured to compare a sensed current of a respective single-ended bit cell of the single-ended bit cells for the read operation to a second reference current. The second reference current is based on the first reference current and respective currents of the first set of reference bit cells and the second set of reference bit cells.

DETAILED DESCRIPTION

Figure 1:
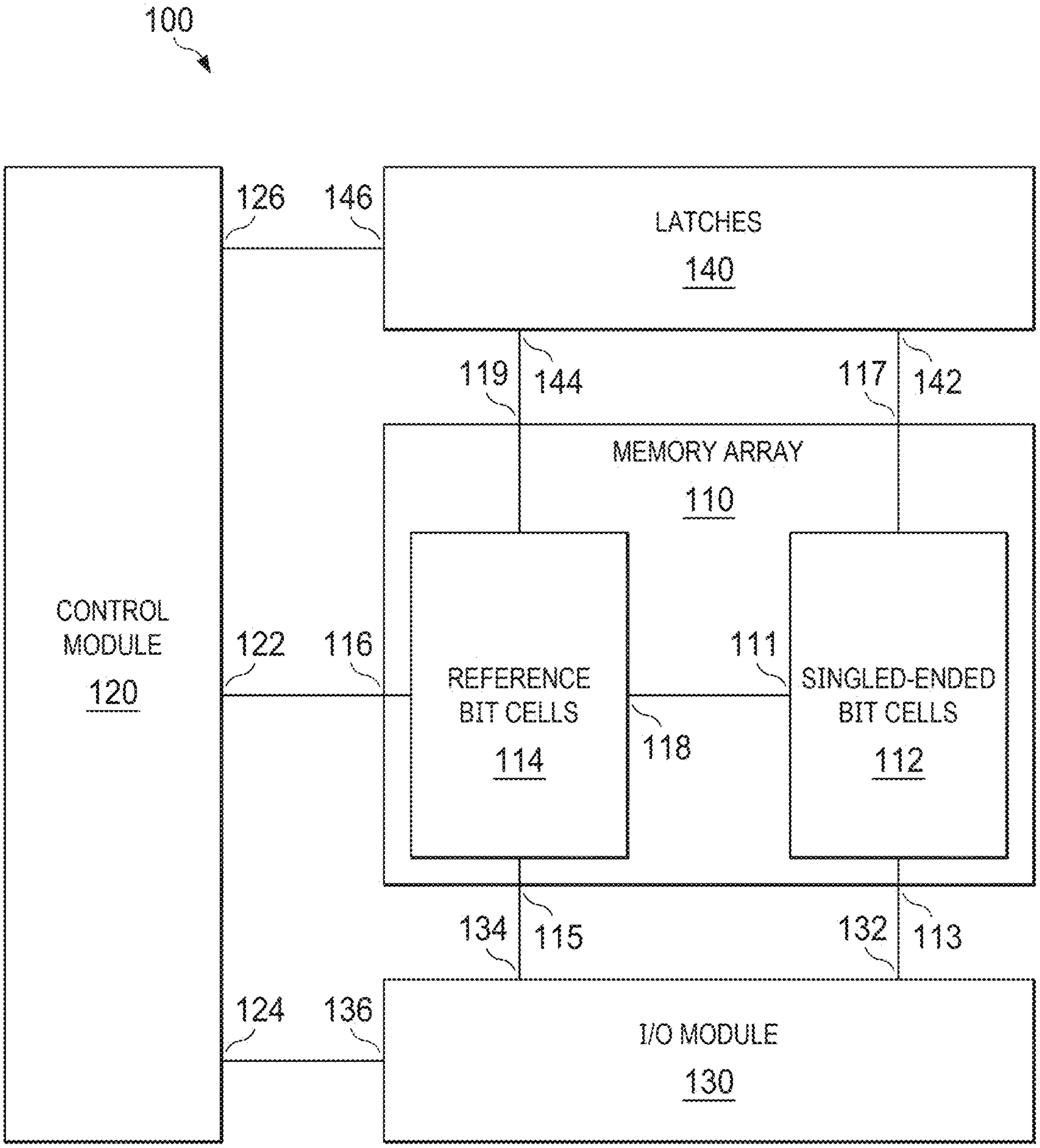
FIG. 1 illustrates a block diagram of a first example non-volatile memory (NVM) circuit.

This description relates to an array of single-ended bit cells (e.g., EEPROM bit cells, flash memory bit cells, one-time programmable (OTP) memory bit cells, etc.) and to a circuit for generating a reference current for the array of single-ended bit cells (e.g., EEPROM bit cells, etc.). In various examples, the circuit includes an array of memory bit cells that includes a set of rows, and a row of the set of rows includes single-ended bit cells and differential bit cells. The reference current for a row of the memory array is generated by combining a fixed reference current with the outputs of the differential bit cells of the row. The differential bit cells of the row include a number of first differential bit cells storing a first binary value (e.g., '0') and the same number of second differential bit cells storing a second binary value (e.g., '1'). When the single-ended bit cells of a row are cycled (e.g., erased, programmed, etc.), the differential bit cells of the row are also cycled by programming them with the opposite values to those stored in the differential bit cells (e.g., erasing/programming differential bit cells storing a first binary value (e.g., '0') to store the second binary value (e.g., '1') and erasing/programming differential bit cells storing the second binary value (e.g., '1') to store the first binary value (e.g., '0'), etc.).

For a differential bit cell (e.g., a differential EEPROM bit cell which includes two floating-gate (FG) transistors), the data value (e.g., '0' or '1') of the bit cell is read by sensing whether a true value stored in one of the FG transistors of the bit cell is higher or lower than an opposite value (e.g., the second current level or the first current level, respectively) stored in the other FG transistor of the bit cell. For example, the true value stored in a respective FG transistor can be a first (e.g., lower) current level associated with a data '0' or a second (e.g., higher) current level associated with a data '1'). For a single-ended memory bit cell (which includes a single FG transistor), the data value of the bit cell is read by sensing whether the value (e.g., the first current level associated with '0' or the second current level associated with '1') stored in the FG transistor is higher or lower than a reference current ($I_{ref}$) between the first and second current levels. For respective first and second current levels across individual cells, the current level of stored data can vary within a range, such that the first current level and second current level are associated with different ranges of current levels for the same (first or second) stored data value.

Over multiple cycles of erasing and programming of a bit cell, the insulator material isolating the FG of the bit cell can wear and the margin between the current values of the first and second binary values can decrease. For example, for a data '0' associated with a first (e.g., lower) current level and a data '1' associated with a second (e.g., higher) current level, over multiple cycles, the current level of the stored data '0' can increase and the current level of the stored data '1' can decrease, reducing the difference in current values between the data '0' and the data '1.' In a differential bit cell, the difference in current values is the sense margin for accurately reading the differential bit cell, while a single-ended bit cell has a smaller sense margin based on the difference between the first current level and $I_{ref}$ or between the second current level and $I_{ref}$. After a large enough number of cycles, the ranges of the first current level and the second current level will drift close enough together that bit errors can result, providing a limited lifetime for an array of FG bit cells, such as an EEPROM array (in terms of cycles of erasing and programming the bit cells). In differential bit cells, these errors can result when the range of the first current level overlaps the range of the second current level. In single-ended bit cells these errors can result when the range of the first current level overlaps $I_{ref}$ and/or the range of the second current level overlaps $I_{ref}$. While single-ended bit cells have a smaller sense margin (and thus shorter lifetime in terms of a maximum number of cycles) than differential bit cells, a single-ended bit cell includes a single FG transistor instead of the two FG transistors of a differential bit cell, leading to an array of single-ended FG bit cells (e.g., EEPROM bit cells, etc.) having approximately double the storage density compared to an array of differential FG bit cells (e.g., EEPROM bit cells, etc.).

How bit cells of a memory array wear over multiple cycles differs between semiconductor dies and thus between different circuits. Additionally, because different rows of the same memory array can be cycled different numbers of times, etc., the ranges of current values for the first current level and the second current level can also vary between rows of the same memory array.

In various examples described herein, a row of a memory array includes single-ended bit cells and differential bit cells, and the reference current for the single-ended bit cells of the row is generated by combining a fixed reference current with the sensed currents of the differential bit cells of the row. When the single-ended bit cells of the row are erased and programmed, the differential bit cells of the row are erased and programmed with opposite values (e.g., differential bit cells with the first current value are erased and programmed with the second current value, and vice versa, etc.). By cycling the differential bit cells of the row the same number of times as the single-ended bit cells of the row, the differential bit cells wear at the same rate as the single-ended bit cells (e.g., have first and second current values that vary over cycles in the same way as the single-ended bit cells of the row, etc.). As a result, the reference current generated based on the outputs of the differential bit cells varies based on the changes in the first and second current levels of the row, providing for a memory array that has a greater lifetime (e.g., number of cycles) and reduced error rate for a given number of cycles when compared with a single-ended memory array without such a reference current and that has an increased (e.g., approximately doubled) storage density (e.g., reduced size and cost for the same number of bit cells or an increased number of bit cells for the same size, etc.) when compared with a differential memory array.

FIG. 1 illustrates a block diagram of a first example non-volatile memory (NVM) circuit 100. The example circuit 100 includes a memory array 110 of FG bit cells that includes single-ended bit cells 112 for storing data and reference bit cells (e.g., differential bit cells, etc.) 114 for generating reference currents. The single-ended bit cells 112 and reference bit cells 114 are arranged in a set of rows and a set of columns such that each row of the memory array 110 includes a set of single-ended bit cells 112 of that row and a set of reference bit cells (e.g., differential bit cells, etc.) 114 of that row.

The memory array 110 includes input/output (I/O) connections 111, 113, 115, 116, 117, 118, and 119. Depending on the example and/or specific I/O connection, I/O connections described herein can provide unidirectional links or bidirectional links. The I/O connections 113 and 115 couple the single-ended bit cells 112 and the reference bit cells 114, respectively, of the memory array 110 to the I/O connections 132 and 134 of the input/output module 130, respectively. The I/O connection 116 couples the memory array 110 to I/O connection 122 of a control module 120. The I/O connections 117 and 119 couple the single-ended bit cells 112 and the reference bit cells 114, respectively, of the memory array 110 to the I/O connections 142 and 144 of latches 140, respectively. I/O connection 111 of the single-ended bit cells 112 and I/O connection 118 of the reference bit cells 114 couple the single-ended bit cells 112 and the reference bit cells 114 together and to the control module 120 via I/O connection 122.

The control module 120 is configured to perform operations on the memory array 110 responsive to inputs to the control module 120 (e.g., inputs to an integrated circuit that is the example circuit 100 or includes the example circuit 100, etc.). In various examples, the operations performed by the control module 120 on the memory array 110 include one or more of a read operation on one or more rows (e.g., on a single row, a pair of rows, or more rows, etc.). Read operations performed in various examples include a read operation to determine stored values of bit cells, a current read operation to directly measure bit cell currents externally, and/or a margin read test to screen out weak bit cells by altering the reference current used in sensing. Additionally, or alternatively, the control module 120 can be configured to perform an erase operation on one or more rows (e.g., on a single row, a pair of rows, or more rows, etc.). In an example, erase operations include a mass erase operation to erase a large number of rows (e.g., 16, 32, 64, all, etc.) in a single operation. Also, or as an alternative, the control module 120 can be configured to perform a program operation on one or more rows (e.g., on a single row, a pair of rows, or more rows. In an example, the operation performed by the control module 120 can be a mass program operation to program a large number of rows (e.g., 16, 32, 64, all, etc.) in a single operation, which can be useful for initializing an array with a pattern such as a checkerboard with fewer program operations than other program operations). In another example, the operation performed by the control module 120 can be a sector operation to group rows into a sector that is inhibited from being erased or programmed, which can be used for preventing an end user from changing the stored data (e.g., trim or configuration data, etc.).

The control module 120 of the circuit 100 receives commands for operations on the memory array 110, outputs responses to some commands (e.g., read operations, etc.). The control module 120 is configured to select rows of the memory array for operations (e.g., read, erase, program, etc.) on one or more rows (e.g., via a set of wordline drivers of the control module 120) based on the commands. The control module 120 is also configured to select and/or generate currents and/or voltages for operations (e.g., a fixed reference current for read operations that control module 120 combines with currents sensed from reference bit cells 114 for sensing the currents of single-ended bit cells 112, etc.) based on the commands.

The control module 120 includes I/O connections 122, 124, and 126. I/O connection 122 couples the control module 120 to the memory array 110 via I/O connection 116. I/O connection 124 couples the control module 120 to the I/O module 130 via I/O connection 136. I/O connection 126 couples the control module 120 to the latches 140 via I/O connection 146.

The input/output (I/O) module 130 is configured to sense (e.g., via a set of differential sense amplifiers, etc.) the data values stored in bit cells of rows of the memory array 110 selected by the control module 120 in connection with operations (e.g., read operations, etc.). For a reference bit cell 114, the I/O module 130 senses the stored data value by comparing the current from a true data value (e.g., '0' or '1') stored in a first FG of the reference bit cell 114 with the current from the opposite data value (e.g., '1' or '0,' respectively) stored in a second FG of the reference bit cell 114. For a single-ended bit cell 112, the I/O module 130 senses the stored data value by comparing the data value (e.g., '0' or '1') stored in the FG of the single-ended bit cell 112 with a reference current generated by the control module 120 based on the fixed reference current and data values read from the reference bit cells 114 of the same row as the single-ended bit cell 112.

The I/O module 130 includes I/O connections 132, 134, and 136. The I/O connection 132 couples the I/O module 130 to the single-ended bit cells 112 of the memory array 110 via I/O connection 113. The I/O connection 134 couples the I/O module 130 to the reference bit cells 114 of the memory array 110 via I/O connection 115. The I/O connection 136 couples the I/O module 130 to the control module 120 via I/O connection 124.

Each row of the memory array 110 includes an even number of the reference bit cells 114. The reference bit cells include a first set of reference bit cells (e.g., n reference bit cells, where n is a positive integer, e.g., 1, 2, 3, etc.) 114 storing a first binary value (e.g., '0' or '1') and a second set of reference bit cells (e.g., n reference bit cells, where n is a positive integer) 114 storing a second binary value (e.g., '1' or '0,' respectively). The physical arrangement of the first set of reference bit cells 114, the second set of reference bit cells 114, and the single-ended bit cells 112 of a row can differ between various examples of the circuit 100 (e.g., alternating the first reference bit cells 114 and the second reference bit cells 114 with each other on one side of the single-ended bit cells 112; the first reference bit cells 114 followed by the second reference bit cells 114 followed by the single-ended bit cells 112 in the row; etc.). In an example, the first set of reference bit cells 114 has the same number (e.g., where n denotes the number of reference bit cells) of reference bit cells 114 as the second set of reference bit cells 114. The control module 120 adds the currents from the reference bit cells 114 of the row to the fixed reference current generated by the control module 120 to generate a total reference current that the control module 120 divides by the number of currents (e.g., 2n+1) added together to generate a reference current for the row (e.g., an average current of the 2n currents from the reference bit cells 114 of the row and the fixed reference current generated by the control module 120). In some examples, the control module 120 is configured to generate a weighted average current of the 2n currents from the reference bit cells 114 of the row and the fixed reference current generated by the control module 120 instead of a simple average (e.g., adding the 2n currents from the reference bit cells 114 of the row to some positive multiple (e.g., k, where k is a positive real number) of the fixed reference current and dividing the total by 2n+k, etc.).

The latches 140 are configured to store values to be programmed to one or more rows. The latches 140 can include volatile memory (VM) such as static random-access memory (SRAM), flip-flops, etc. arranged in one or more rows. For example, the number of rows of the latches 140 can provide a maximum number of different rows for simultaneous programming, such as two rows of latches for simultaneous programming of two different rows, etc. In various examples of the circuit 100, the physical arrangement of the memory array 110, the I/O module 130, and the latches 140 may vary. For example, a first portion of the latches 140 can reside on one side of the memory array 110 and a second portion of the latches 140 on the other side of the memory array 110 along with the I/O module 130. Alternatively, the latches 140 can reside on the other side of the memory array 110 from the I/O module 130. Still other physical arrangements of the memory array 110, the I/O module 130, and the latches 140 can be used in other examples.

The latches 140 include I/O connections 142, 144, and 146. The I/O connection 142 couples the latches 140 to the single-ended bit cells 112 of the memory array 110 via I/O connection 117. The I/O connection 144 couples the latches 140 to the reference bit cells 114 of the memory array 110 via I/O connection 119. The I/O connection 146 couples the latches 140 to the control module 120 via I/O connection 126.

Various examples of the circuit 100 cycle the reference bit cells 114 of a row the same number of times as the single-ended bit cells 112 of the row, such that the reference current generated based on the reference bit cells 114 of the row changes over cycles along with the changes in the current levels of the first and second binary values in the single-ended bit cells 112 of the row. Weak "off program" bits (e.g., bits at the lower of the first and second current values associated with the first and second binary values) degrade with cycling, and can have a small amount of current, which varies based on the example circuit 100 (e.g., in some examples of the circuit 100, such bits can have ~7 μA to ~10 μA depending on the example circuit 100, such as 6 μA-11 μA, 5 μA-12 μA, etc.). Cycling the reference bit cells 114 of a row along with the single-ended bit cells 112 of the row provides for a reference current generated based on the reference bit cells 114 of the row that is useable for a larger number of cycles, improving the lifetime of the circuit 100. In various examples, the reference bit cells 114 of a respective row are cycled along with the single-ended bit cells 112 of the respective row by performing a read operation, an erase operation, and a program operation in sequence to program the single-ended bit cells 112 of the row. For example, for a circuit 100 with read, erase, and program operations on m rows (e.g., m is a positive integer denoting the number of rows being programmed in a given operation), when a word on the m rows is read, the reference bit cells 114 of the row are differentially sensed, and the opposite states of the reference bit cells 114 are stored in the latches 140 (e.g., '0' is stored in the latches 140 for a '1' read from a reference bit cell 114, and vice versa). After storing the opposite values for the reference bit cells 114 (along with values to program to the single-ended bit cells 112), the m rows are erased. Thus, after writing data to the latches 140, an opposite value will be stored in the latches 140 for each reference bit cell 114 of the m rows. As a result, when the values stored in the latches 140 are programmed to the m rows of the memory array 110, the reference bit cells 114 of the m rows will be cycled along with the single-ended bit cells 112.

In some examples, circuit 100 is configured for dual row program and erase and read-only memory (ROM)-like reading capability, with synchronous NVM erase, NVM program and NVM read, and synchronous read and write capability in the latches 140, which are configured as two rows of SRAM. In some examples, the circuit 100 has a 1.7 V-1.9 V interface, with a power supply voltage that ranges from 1.2 V-2.1 V for erase and program operations and 1 V-2.1 V for read operations, a peak to peak high voltage range of 17 V-19 V for erase operations and 14.5 V-16.5 V for program operations, a bias current for high voltage of 200 nA-300 nA, and a bitline voltage of 4.5 V-6.5 V for program operations.

Figure 2:
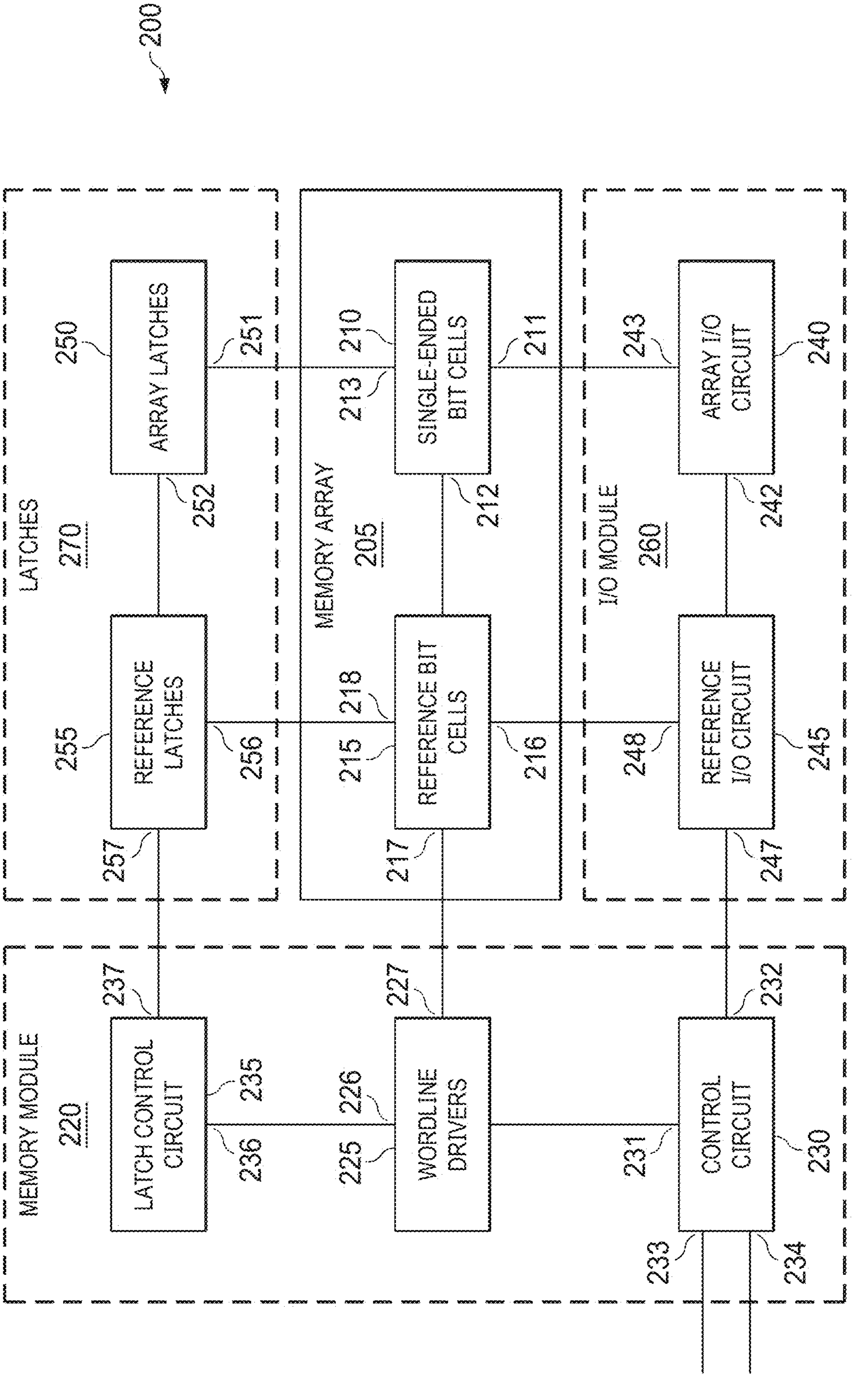
FIG. 2 illustrates a block diagram of a second example NVM circuit.

FIG. 2 illustrates a block diagram of a second example NVM circuit 200. In some examples, the circuit 200 is an example of the circuit 100. The circuit 200 includes a memory array 205 analogous to the memory array 110 of FIG. 1 (e.g., including FG memory bit cells arranged in rows and columns, etc.) that includes single-ended bit cells 210 analogous to the single-ended bit cells 112 of FIG. 1 and reference bit cells 215 analogous to the reference bit cells 114 of FIG. 1.

Single-ended bit cells 210 include I/O connections 211, 212, and 213. I/O connection 211 couples single-ended bit cells 210 to the array I/O circuit 240 via I/O connection 243. I/O connection 212 couples single-ended bit cells 210 to the reference bit cells 215 via I/O connection 217 and to the wordline drivers 225 via I/O connection 227. I/O connection 213 couples the single-ended bit cells 210 to the array latches 250 via I/O connection 251.

Reference bit cells 215 include I/O connections 216, 217, and 218. I/O connection 216 couples reference bit cells 215 to the reference I/O circuit 245 via I/O connection 248. I/O connection 217 couples reference bit cells 215 to the single-ended bit cells 210 via I/O connection 212 and to the wordline drivers 225 via I/O connection 227. I/O connection 218 couples the reference bit cells 215 to the reference latches 255 via I/O connection 256.

The circuit 200 also includes a set of wordline drivers 225 configured to select respective rows of the memory array 205 for memory operations (e.g., read, erase, program, etc.). The wordline drivers 225 include I/O connections 226 and 227. I/O connection 226 couples the wordline drivers 225 to a control circuit 230 via I/O connection 231 and to a latch control circuit 235 via I/O connection 236. I/O connection 227 couples the wordline drivers 225 to the single-ended bit cells 210 via I/O connection 212 and to the reference bit cells 215 via I/O connection 217.

The control circuit 230 of the circuit 200 has one or more input terminals 233 at which it receives commands for the circuit 200 (e.g., as external inputs to the circuit 200 or an IC that includes the circuit 200, such as via external pins of the IC, etc.) to perform operations on the memory array 205. The control circuit 230 is configured to provide outputs from the circuit 200 (e.g., responsive to read operations, etc.) at one or more output terminals 234. The control circuit 230 also is configured to select rows of the memory array 205 via the wordline drivers 225, and to receive data read from the single-ended bit cells 210 and the reference bit cells 215 via the array I/O circuit 240 and the reference I/O circuit 245, respectively. Additionally, the control circuit 230 generates one or more fixed reference currents (e.g., a current for read operations and a higher current for program operations, etc.) and combines the fixed reference current with outputs from the reference bit cells 215 of a row to generate a reference current for use by the array I/O circuit 240 to read single-ended bit cells 210 of that row. The control circuit 230 includes I/O connections 231 and 232. The I/O connection 231 couples the control circuit 230 to the wordline drivers 225 via I/O connection 226 and to the latch control circuit 235 via I/O connection 236. The I/O connection 232 couples the control circuit 230 to the array I/O circuit 240 via I/O connection 242 and to the reference I/O circuit 245 via I/O connection 247.

The latch control circuit 235 is configured to provide data to the array latches 250 (e.g., program data received via the control circuit 230 and/or values read from the single-ended bit cells 210 by the array I/O circuit 240, etc.) and the reference latches 255 (e.g., opposite values to those read from the reference bit cells 215 by the reference I/O circuit) for temporary storage, and provides values stored in the array latches 250 and the reference latches 255 for programming to the single-ended bit cells 210 and the reference bit cells 215. The latch control circuit 235 includes I/O connections 236 and 237. I/O connection 236 couples the latch control circuit 235 to the wordline drivers 225 via I/O connection 226 and to the control circuit 230 via I/O connection 231. I/O connection 237 couples the latch control circuit 235 to the array latches 250 via I/O connection 252 and to the reference latches 255 via I/O connection 257.

The control module 220 includes wordline drivers 225, the control circuit 230, and the latch control circuit 235, and is an example of the control module 120 of FIG. 1.

The array I/O circuit 240 includes differential sense amplifiers configured to determine data values of the single-ended bit cells 210 based on a comparison of a current from a single-ended bit cell 210 with a reference current from the control circuit 230 generated based on averaging a fixed reference current with currents from the reference bit cells 215 of the same row (e.g., adding a fixed reference current to the currents from the 2n reference bit cells 215 of the same row as the single-ended bit cell 210 and dividing by 2n+1, or using a weighted average, etc.). The array I/O circuit includes I/O connections 242 and 243. I/O connection 242 couples the array I/O circuit 240 to the reference I/O circuit 245 via I/O connection 247 and to the control circuit 230 via the I/O connection 232. I/O connection 243 couples the array I/O circuit 240 to the single-ended bit cells 210 via I/O connection 211.

The reference I/O circuit 245 includes differential sense amplifiers configured to determine currents (e.g., for generating a reference current for the I/O circuit 240) and/or data values (e.g., for storing opposite values in the reference latches 255) of the reference bit cells 215 by comparing the currents of the two values (e.g., a true data value and an opposite data value, etc.) stored in a reference bit cell 215 with each other. The reference I/O circuit 245 includes I/O connections 247 and 248. I/O connection 247 couples the reference I/O circuit 245 to the array I/O circuit 240 via I/O connection 242 and to the control circuit 230 via I/O connection 232. I/O connection 248 couples the reference I/O circuit 245 to the reference bit cells 215 via I/O connection 216.

The I/O module 260 includes the array I/O circuit 240 and the reference I/O circuit 245, and is an example of the I/O module 130 of FIG. 1.

The array latches 250 and reference latches 255 store values to be programmed to the single-ended bit cells 210 and the reference bit cells 215, respectively, in rows of the memory array 205 selected by wordline drivers 225 for program operations. In various examples of the circuit 200, the array latches 250 and/or the reference latches 255 are volatile memory (VM) such as SRAM, flip-flops, etc. The array latches 250 include I/O connections 251 and 252. I/O connection 251 couples the array latches 250 to the single-ended bit cells 210 via I/O connection 213. I/O connection 252 couples the array latches 250 to the reference latches 255 via I/O connection 257 and to the latch control circuit 235 via I/O connection 237. The reference latches 255 include I/O connections 256 and 257. I/O connection 256 couples the reference latches 250 to the reference bit cells 215 via I/O connection 218. I/O connection 257 couples the reference latches 255 to the array latches 250 via I/O connection 252 and to the latch control circuit 235 via I/O connection 237.

The latches 270 includes the array latches 250 and the reference latches 255, and is an example of the latches 140 of FIG. 1.

Figure 3A:
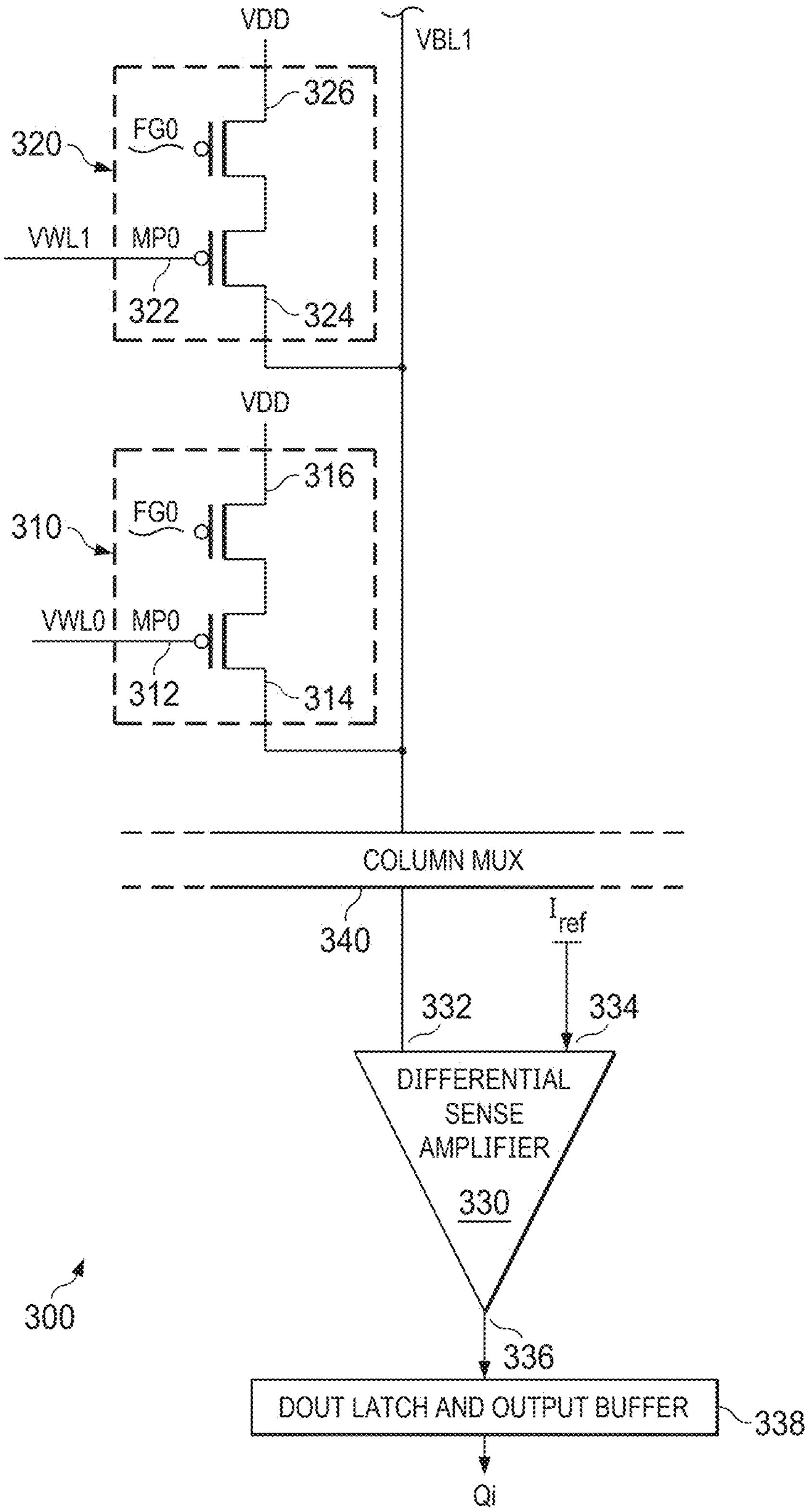
FIGS. 3A and 3B illustrate examples of circuit diagrams showing single-ended bit cells with associated input/output (I/O) circuitry and differential bit cells with associated I/O circuitry.
Figure 3B:
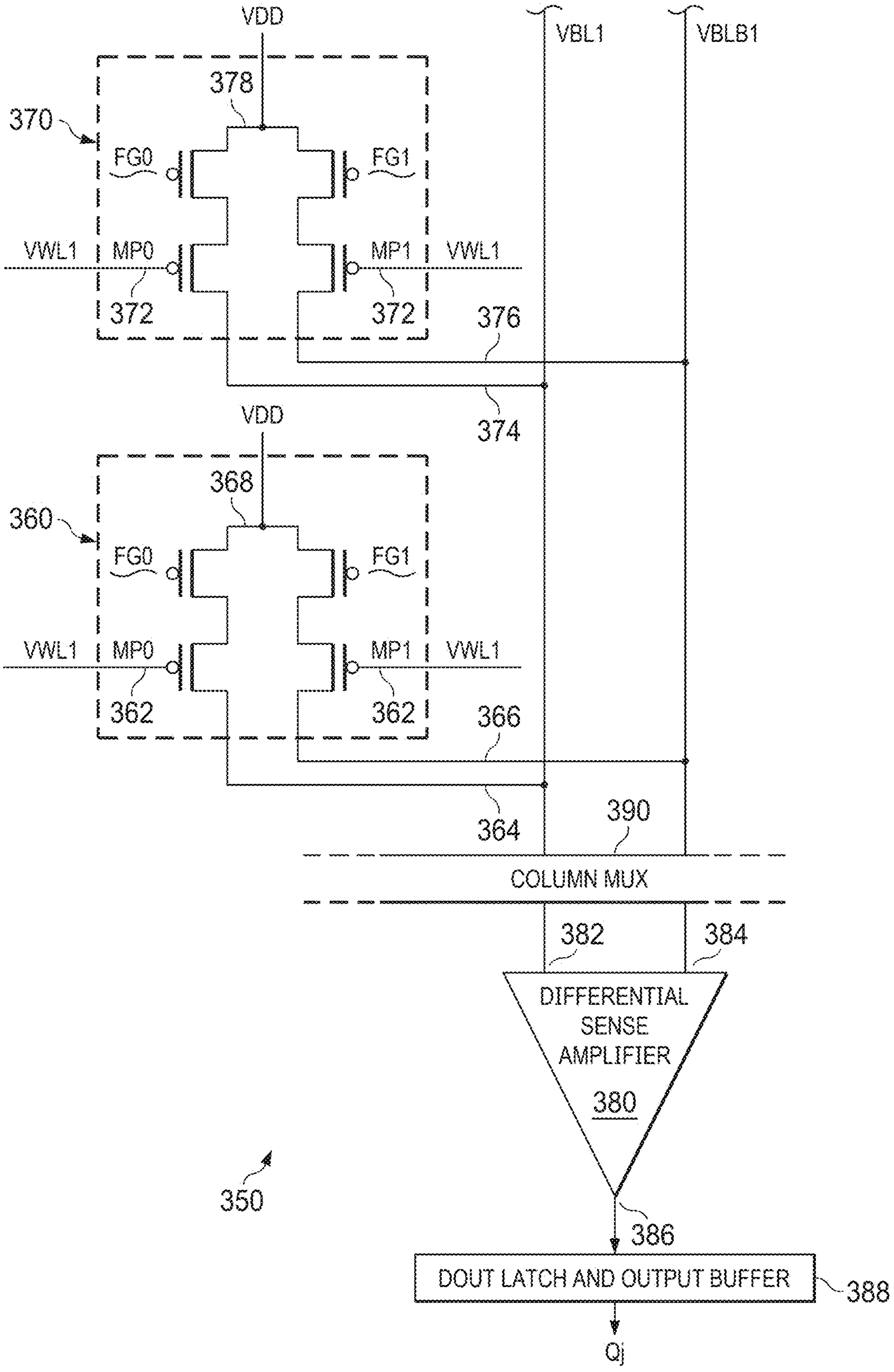

FIGS. 3A and 3B illustrate examples of circuit diagrams of I/O circuitry 300 and 350, in which the I/O circuitry 300 includes single-ended bit cells 310 and 320 and the I/O circuitry 350 includes differential bit cells 360 and 370.

For an example memory array (e.g., the memory array 110 of FIG. 1, the memory array 205 of FIG. 2, etc.), the I/O circuitry 300 is a portion of a bitline (e.g., bitline 1) showing single-ended bit cells 310 and 320. For example, the single-ended bit cells 310 and 320 can be used as data, error check, etc. bit cells (e.g., as single-ended bit cells 112 of FIG. 1, single-ended bit cells 210 of FIG. 2, etc.), such as the first two single-ended bit cells (e.g., on wordlines 0 and 1, etc.) of the memory array on the bitline, closest to differential sense amplifier 330 (e.g., included in I/O module 130 of FIG. 1, in array I/O circuit 232 of FIG. 2, etc.). Single-ended bit cell 310 and single-ended bit cell 320 both include a single floating gate transistor (labeled FG0) with a drain coupled at terminal 316 or 326, respectively to a voltage VDD and a source coupled to the drain of a p-channel metal oxide semiconductor field effect transistor (PMOSFET, labeled MP0). The gate of PMOSFET MP0 of single-ended bit cells 310 and 320 are coupled via wordline terminal 312 and wordline terminal 322, respectively to respective wordlines providing voltages VWL0 and VWL1. Depending on the example and/or specific terminal, terminals described herein can provide unidirectional links or bidirectional links. The sources of the MP0s of the single-ended bit cells 310 and 320 are coupled via terminals 314 and 324, respectively, via a bitline 1 at voltage VBL1 to a first (input) terminal 332 of differential sense amplifier 330 via column multiplexer 340.

Differential sense amplifier 330 also has a second input terminal 334 and a third output terminal 336. The second input terminal 334 is coupled to a current source configured to provide a reference current, shown as $I_{ref}$. The differential sense amplifier 330 is configured to compare a current from single-ended bit cell 310 or 320 received via first terminal 332 with the reference current $I_{ref}$. For example, the reference current $I_{ref}$ is generated by a control module, control circuit, and/or reference current generator as described herein (e.g., by control module 120 of FIG. 1, control circuit 230 of FIG. 2, etc.). The differential sense amplifier 330 is configured to provide a comparison result at the output terminal 336 based on the reference current $I_{ref}$ and the currents of single-ended bit cells 310 and 320 that are cycled along with other bit cells of the row of the selected single-ended bit cell, etc. The output terminal 336 is coupled to an input of a data output (Dout) latch and output buffer, shown at 338. For example, the Dout latch and output buffer 338 can be implemented as the latches 140 of FIG. 1, or the array latches 250 of FIG. 2, and/or output buffer of differential sense amplifier 330. The Dout latch and output buffer 338 is configured to store the result at the output terminal 336.

Similarly, for an example memory array (e.g., the memory array 110 of FIG. 1, the memory array 205 of FIG. 2, etc.), the I/O circuitry 350 depicts a portion of a bitline (e.g., bitline 1) showing differential bit cells 360 and 370. The differential bit cells 360 and 370 may be used to provide a reference voltage to the bitline, and may sometimes be referred to as reference bit cell 360 and reference bit cell 370. For example, the I/O circuitry can be used to implement reference bit cells, such as reference bit cells 114 of FIG. 1, reference bit cells 215 of FIG. 2, etc.) as the first two differential bit cells (e.g., on wordlines 0 and 1, etc.) of the memory array on the bitline, closest to differential sense amplifier 380 (e.g., included in I/O module 130 of FIG. 1, in reference I/O circuit 245 of FIG. 2, etc.). Reference bit cell 360 includes floating gate transistors FG0 and FG1 with drains coupled at terminal 368 to a voltage VDD and sources coupled to the drains of PMOSFETs MP0 and MP1, respectively, of reference bit cell 360. Reference bit cell 370 includes floating gate transistors FG0 and FG1 with drains coupled at terminal 378 to voltage VDD and sources coupled to the drains of PMOSFETs MP0 and MP1, respectively, of reference bit cell 370. The gates of PMOSFETs MP0 and MP1 of reference bit cell 360 are connected via terminal 362 to wordline 0 providing voltage VWL0, and the gates of PMOSFETs MP0 and MP1 of reference bit cell 370 are connected via terminal 372 to wordline 1 providing voltage VWL1. The sources of the MP0s of the reference bit cells 360 and 370 are coupled via terminals 364 and 374, respectively, via bitline 1 at voltage VBL1 to a first input terminal 382 of differential sense amplifier 380 via column multiplexer 390. The sources of the MP1s of the reference bit cells 360 and 370 are coupled via terminals 366 and 376, respectively, via bitline $\bar{1}$ (1 bar) at voltage VBLB1 to a second input terminal 384 of differential sense amplifier 380 via column multiplexer 390.

The differential sense amplifier 380 is configured to compare a current from a first (true) side of reference bit cell 360 or 370 received via first input terminal 382 from terminal 364 or 374 with a second (false) side of reference bit cell 360 or 370 received via second input terminal 384 from terminal 366 or 376. The differential sense amplifier 380 is configured to provide a comparison result at the output terminal 386 based on the reference current currents of the true and false sides of reference bit cells 360 or 370. The output terminal 386 is coupled to an input of a data output (Dout) latch and output buffer, shown at 388. For example, the Dout latch and output buffer 388 can be implemented as the latches 140 of FIG. 1, or the reference latches 255 of FIG. 2, and/or output buffer of differential sense amplifier 380. The Dout latch and output buffer 388 is configured to store the result at the output terminal 386.

Figure 4:
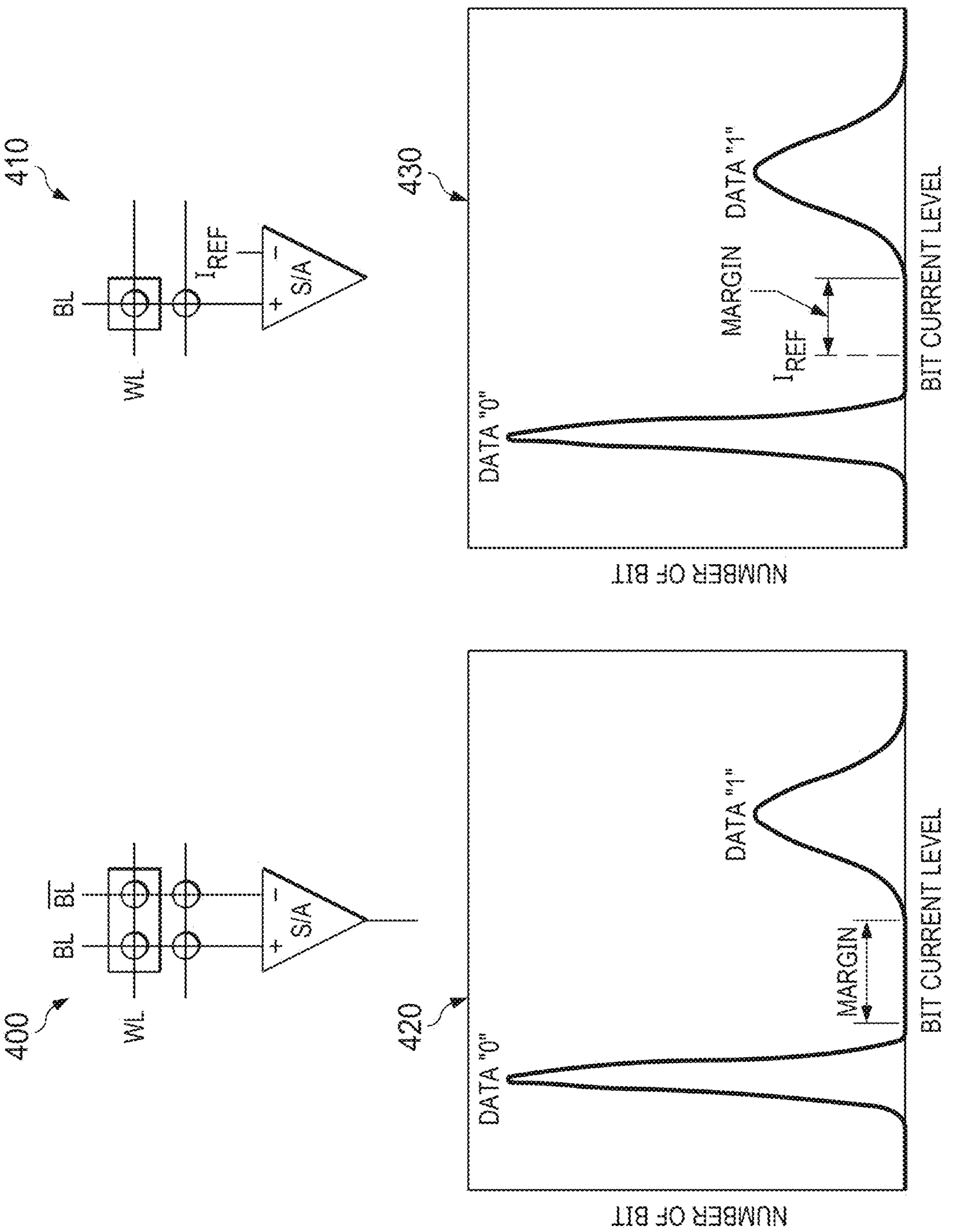
FIG. 4 illustrates diagrams comparing differential and single-ended bit cells of examples, along with charts illustrating the differing sense margins between differential and single-ended bit cells.

FIG. 4 shows diagrams comparing a differential bit cell at 400 with a single-ended bit cell at 410 as used for data storage in the memory arrays of various examples, along with charts 420 and 430 illustrating the differing sense margins between differential and single-ended bit cells, respectively. As can be seen at 400 and 410 (and in FIG. 3A), the single-ended bit cells used for data storage in the memory arrays of various examples use half the transistors of differential bit cells, taking up approximately half the space. Additionally, while single-ended bit cells have a smaller sense margin than differential bit cells (as shown in charts 430 and 420, respectively) the reference current generated by various examples (e.g., using a fixed reference current combined with currents from reference bit cells of a row to generate the reference current used to sense single-ended bit cells of the row, etc.) improves the lifetime of the various examples compared to comparable double-ended bit cells.

Figure 5A:
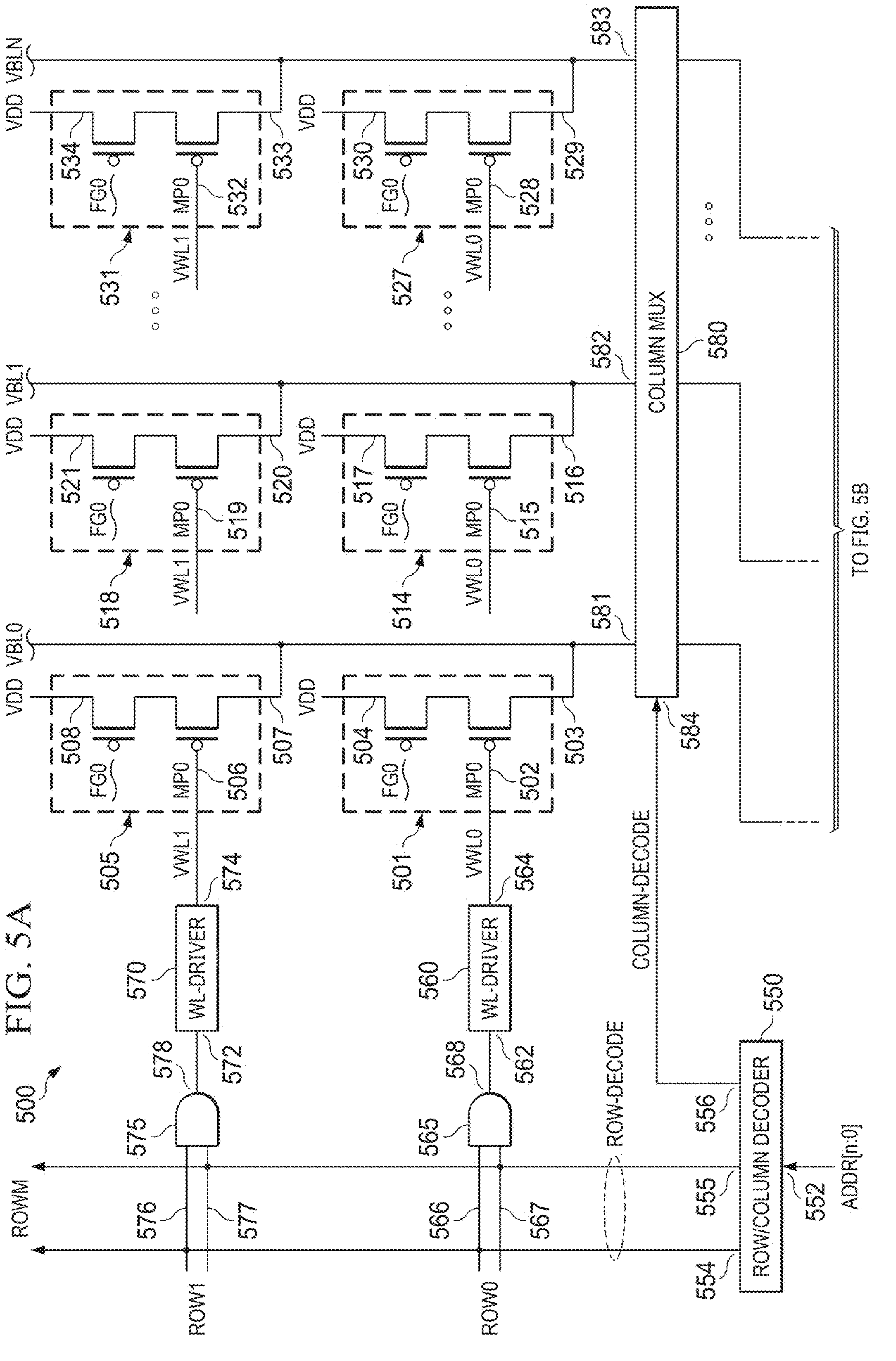
FIGS. 5A and 5B illustrate a circuit diagram of a portion of a third example NVM circuit.
Figure 5B:
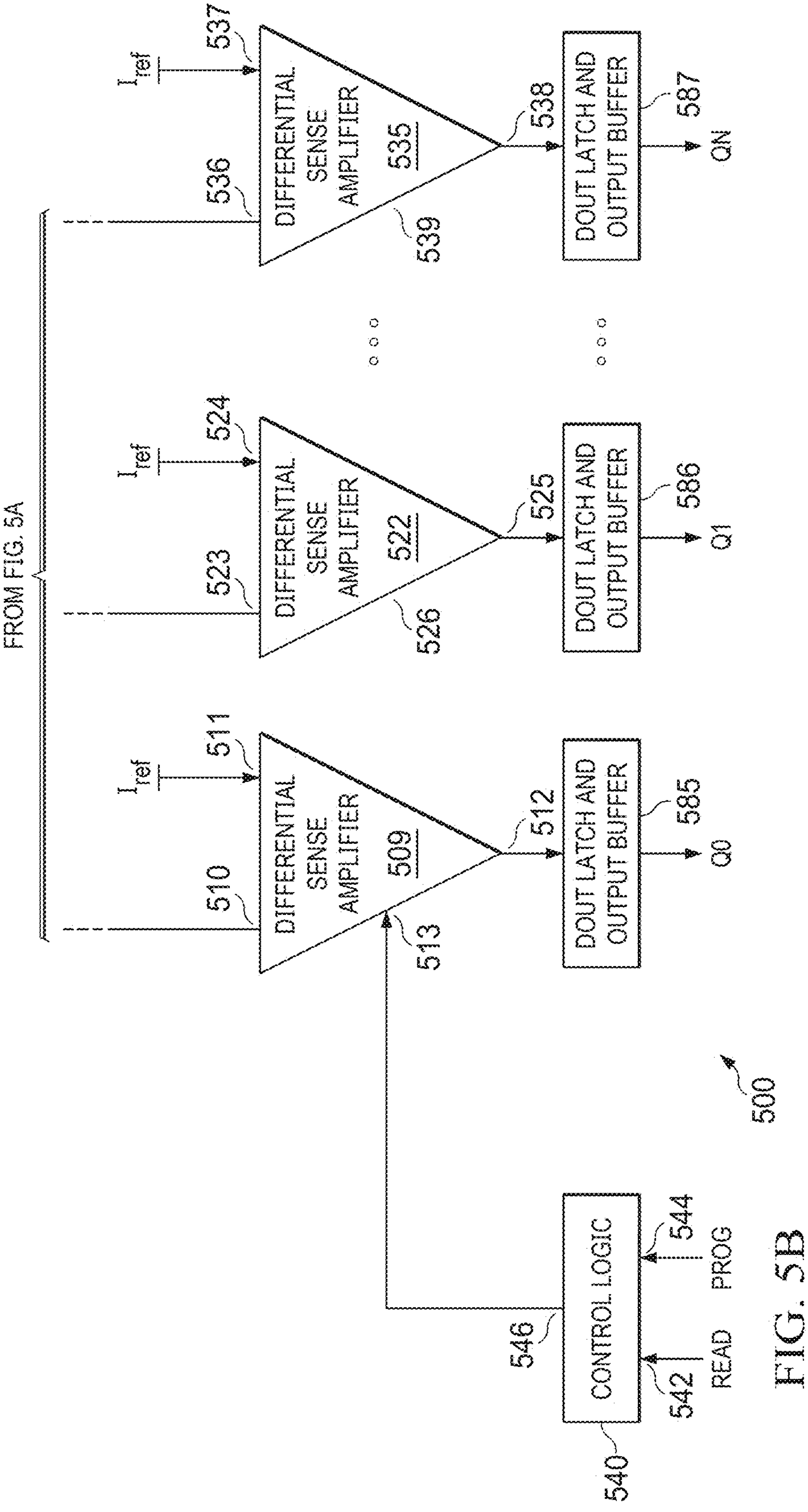

FIGS. 5A and 5B illustrate a circuit diagram of a portion of a third example NVM circuit 500. The illustrated portion of circuit 500 in FIGS. 5A and 5B show single-ended bit cells 501 (having terminals 502, 503, and 504) and 505 (having terminals 506, 507, and 508) on bitline 0 (with voltage VBL0) coupled via terminals 503 and 507, respectively to terminal 510 of a first differential sense amplifier 509 (having terminals 510, 511, 512, and 513) via terminal 581 of column multiplexer 580. The circuit 500 also includes single-ended bit cells 514 (having terminals 515, 516, and 517) and 518 (having terminals 519, 520, and 521) on bitline 1 (with voltage VBL1) coupled via terminals 516 and 520, respectively to terminal 523 of a second differential sense amplifier 522 (having terminals 523, 524, 525, and 526) via terminal 582 of column multiplexer 580. The circuit 500 includes additional columns of single-ended bit cells on additional bitlines, of which are shown single-ended bit cells 527 (having terminals 528, 529, and 530) and 531 (having terminals 532, 533, and 534) on bitline n (with voltage VBLn) coupled via terminals 529 and 533, respectively to terminal 536 of an nth differential sense amplifier 535 (having terminals 536, 537, 538, and 539) via terminal 583 of column multiplexer 580. Single-ended bit cells 501, 505, 514, 518, 527, and 531 are coupled to a drain voltage VDD via terminals 504, 508, 517, 521, 530, and 534, respectively. Single-ended bit cells 501, 514, and 527 are coupled to terminal 564 of wordline driver 560 on wordline 0 (at voltage VWL0) via terminals 502, 515, and 528, respectively. Single-ended bit cells 505, 518, and 531 are coupled to terminal 574 of wordline driver 570 on wordline 1 (at voltage VWL1) via terminals 506, 519, and 532, respectively.

Differential sense amplifiers 509, 522, and 535 are additionally coupled to reference currents $I_{ref}$ via terminals 511, 524, and 537, respectively. In various examples, the reference currents $I_{ref}$ are fixed, vary based on an array of bit cells, or vary based on reference bit cells of the specific row for which the reference current $I_{ref}$ is generated. Differential sense amplifiers 509, 522, and 535 are connected via terminals 512, 525, and 538 to Dout latches and output buffers 585, 586, and 587, respectively, similarly to differential sense amplifier 330 and Dout latch and output buffer 338 of FIG. 3. Additionally, differential sense amplifiers 509, 522, and 535 are connected via terminals 513, 526, and 539 to terminal 546 of control logic 540, via a voltage that depends on the selected operation (e.g., a read operation, a program operation, etc.).

Control logic 540 includes terminals 542 and 544 to receive instructions indicating a selected operation (e.g., a read operation, a program operation, etc.) and outputs a voltage based on the selected operation via terminal 546 to differential sense amplifiers 509, 522, and 535 via respective terminals 513, 526, and 539.

The circuit 500 also includes a row/column decoder 550 having terminals 552, 554, 555, and 556. Row/column decoder 550 receives addresses via terminal 542. Based on the received addresses, row/column decoder 550 selects rows of bit cells for operations via terminals 554 and 555 coupled to AND gate 565 via terminals 566 and 567 and to AND gate 575 via terminals 576 and 577, where AND gates 565 and 575 are coupled via output terminals 568 and 578, respectively, to wordline drivers 560 and 570 via terminals 562 and 572, respectively. Additionally, based on the received addresses, row/column decoder 550 selects columns of bit cells for operations via terminal 556 coupled to terminal 584 of column multiplexer 580.

Wordline drivers such as wordline drivers 560 and 570 receive signals via terminals 562 and 572, respectively, when selected for row operations, and provide wordline voltages via respective terminals 564 and 574 to bit cells on selected wordlines (e.g., single-ended bit cells 501, 514, and 527 and/or single-ended bit cells 505, 518, and 531, etc.), which receive these voltages via respective terminals coupled to the wordlines (e.g., terminals 502, 515, and 528 on wordline 0 and/or terminals 506, 519, and 532 on wordline 1).

For selected bit cells, differential sense amplifiers (e.g., differential sense amplifiers 509, 522, and/or 535, etc.) are configured to compare currents from the selected bit cells with a reference current $I_{ref}$, which is generated in a variety of ways in various examples (e.g., a reference current generated based on adding currents of reference bit cells to a fixed reference current and dividing by a fixed quantity, etc.).

Figure 6A:
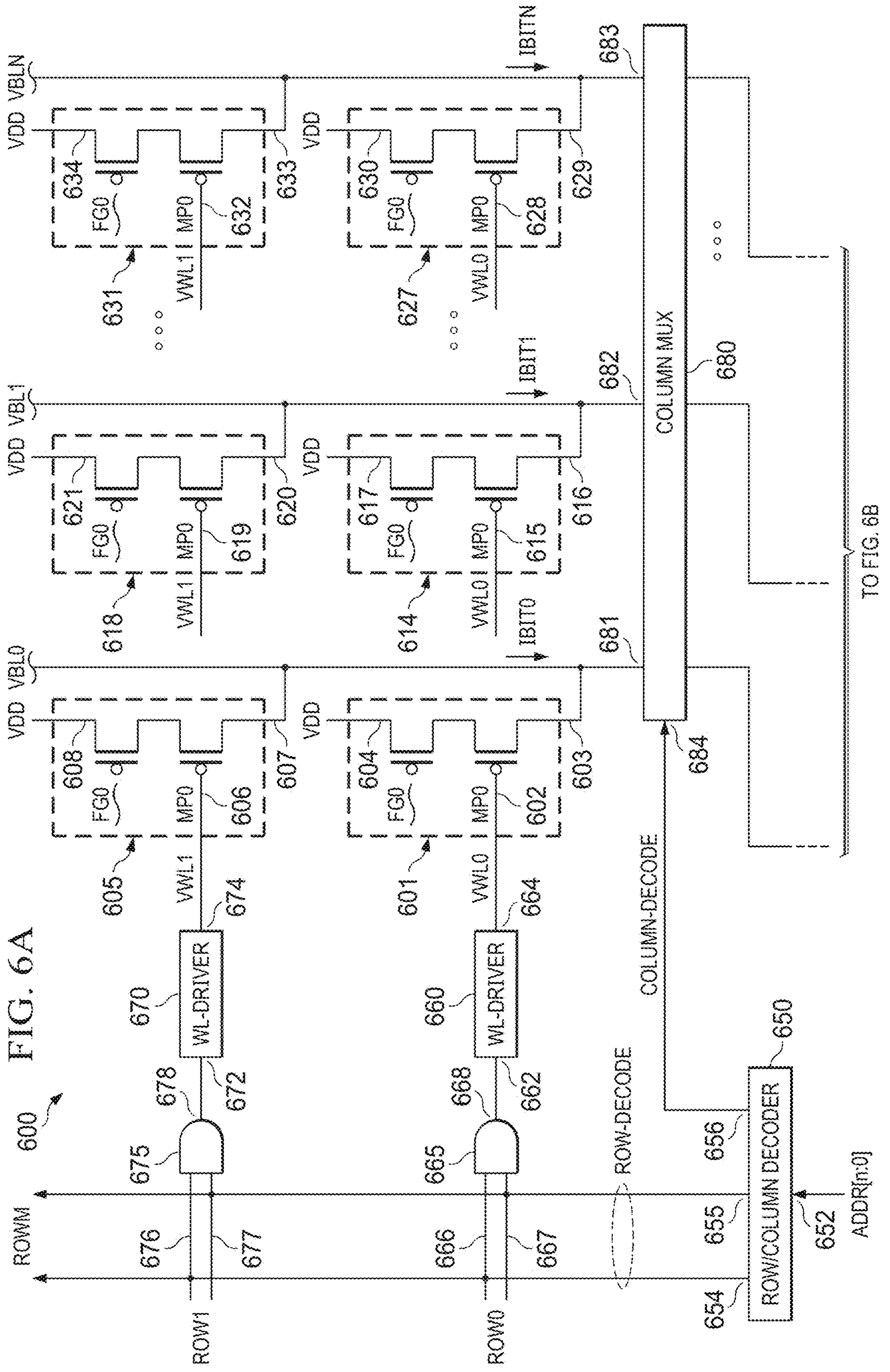
FIGS. 6A and 6B illustrate a circuit diagram of a portion of a fourth example NVM circuit.
Figure 6B:
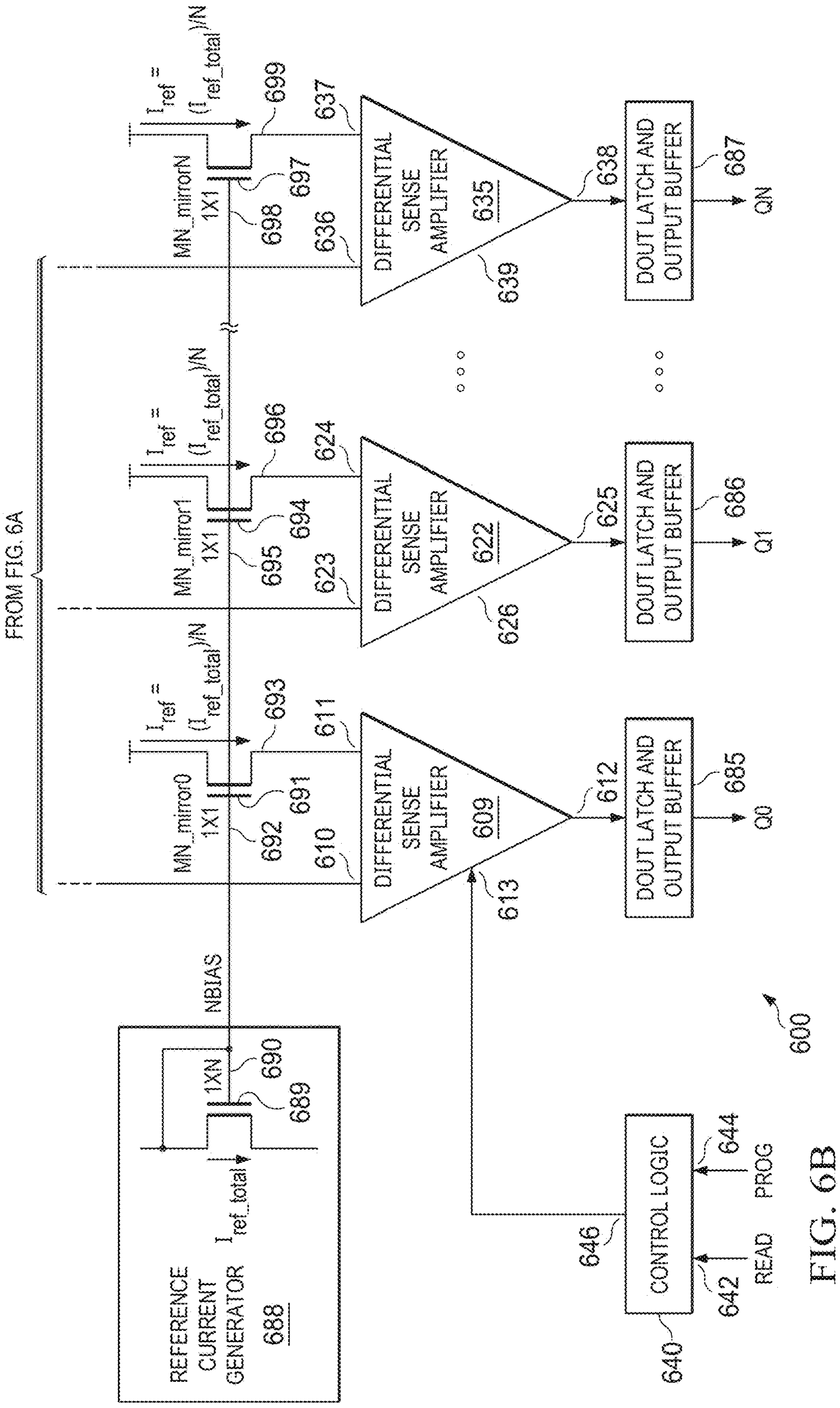

FIGS. 6A and 6B illustrate a circuit diagram of a portion of a fourth example NVM circuit 600. Components and terminals shown in FIGS. 6A and 6B at 601-687 are analogous to correspondingly numbered components and terminals shown in FIGS. 5A and 5B at 501-587. Additionally, FIGS. 6A and 6B also includes a reference current generator 688 that generates a total reference current that is divided and mirrored to the differential sense amplifiers (e.g., differential sense amplifiers 609, 622, and 635) coupled to single-ended bit cells (e.g., single-ended bit cells 601, 605, 614, 618, 627, and 631) via a set of current mirrors such as n-channel metal-oxide semiconductor field effect transistor (NMOSFET) current mirrors 691, 694, and 697. The structure of reference current generator 688 varies between examples and can include any of the structures of reference current generators discussed herein. Reference current generator 688 includes an NMOS current divider 689 that divides a current $I_{ref\_total}$ by a number of columns (e.g., N) to provide a terminal $I_{ref}$ at terminal 690, which is coupled to terminal 692 of current mirror 691, terminal 695 of current mirror 694, and terminal 698 of current mirror 697. Terminal 693 of current mirror 691 is coupled to terminal 611 of differential sense amplifier 609 to provide $I_{ref}$, terminal 696 of current mirror 694 is coupled to terminal 624 of differential sense amplifier 622 to provide $I_{ref}$, and terminal 699 of current mirror 697 is coupled to terminal 637 of differential sense amplifier 635 to provide $I_{ref}$.

Figure 7:
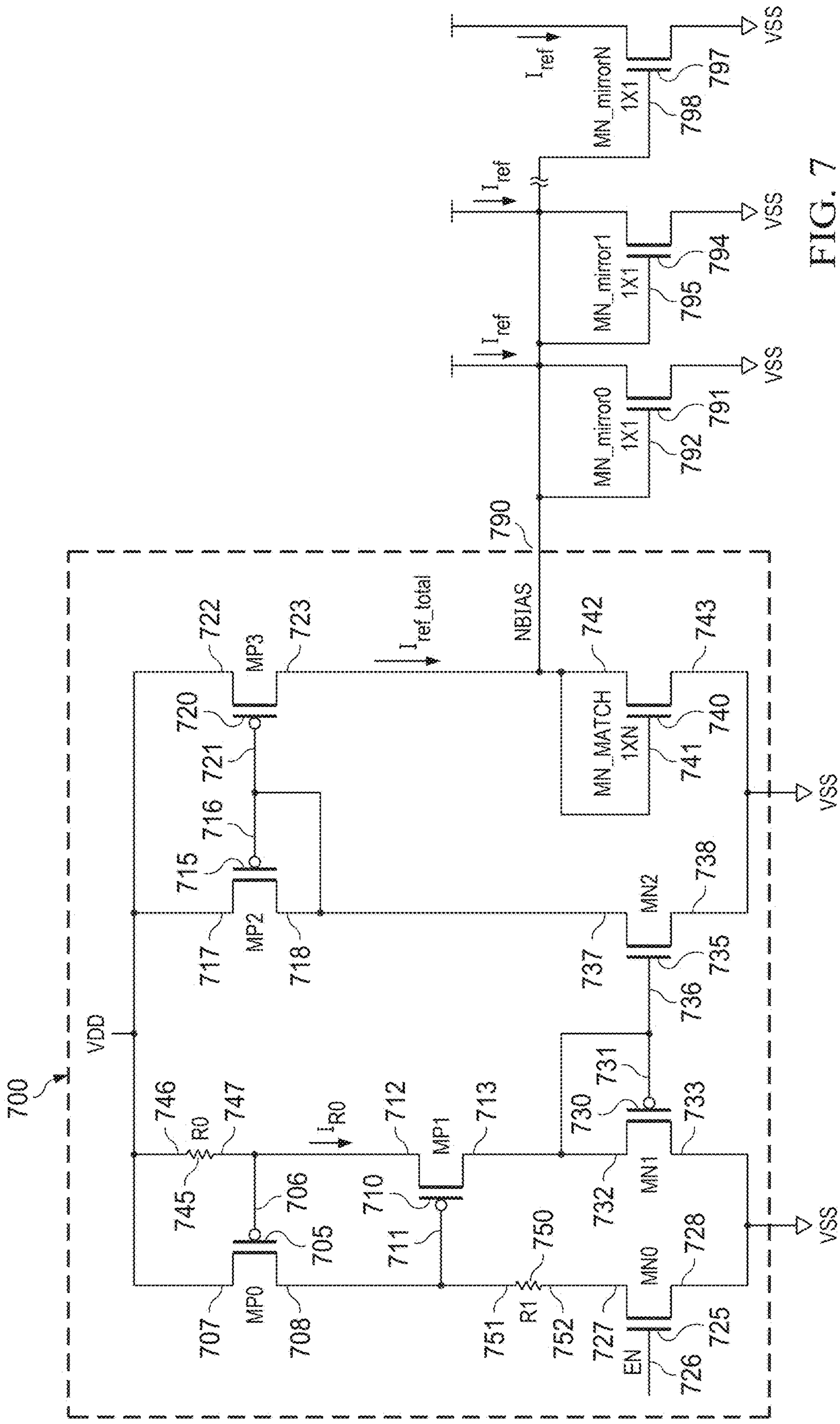
FIG. 7 illustrates a circuit diagram of a first example reference current generator that generates a fixed reference current for a memory array.
Figure 8:
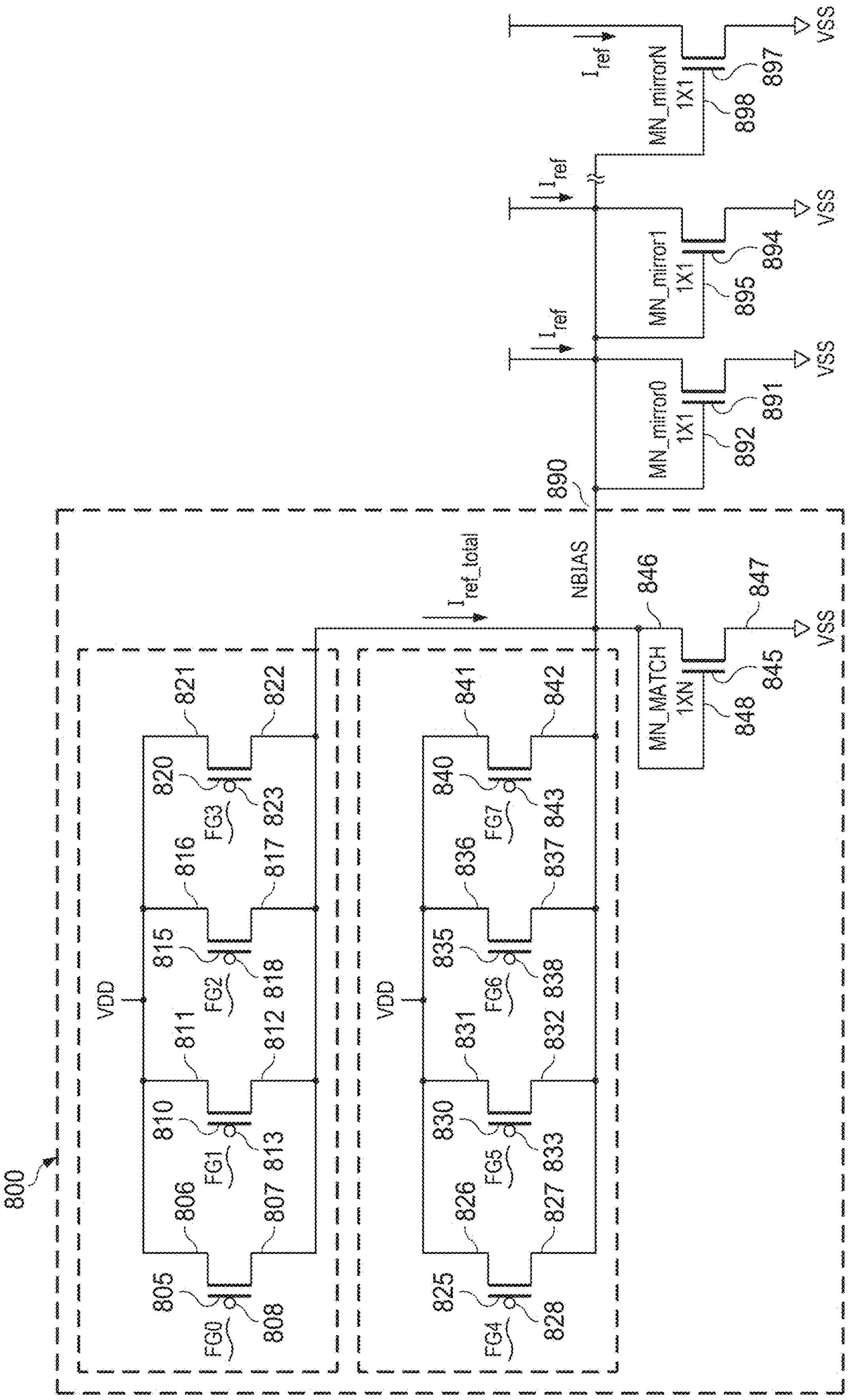
FIG. 8 illustrates a circuit diagram of a second example reference current generator that generates a reference current for a memory array via on and off currents from a separate mini array of bit cells.
Figure 9:
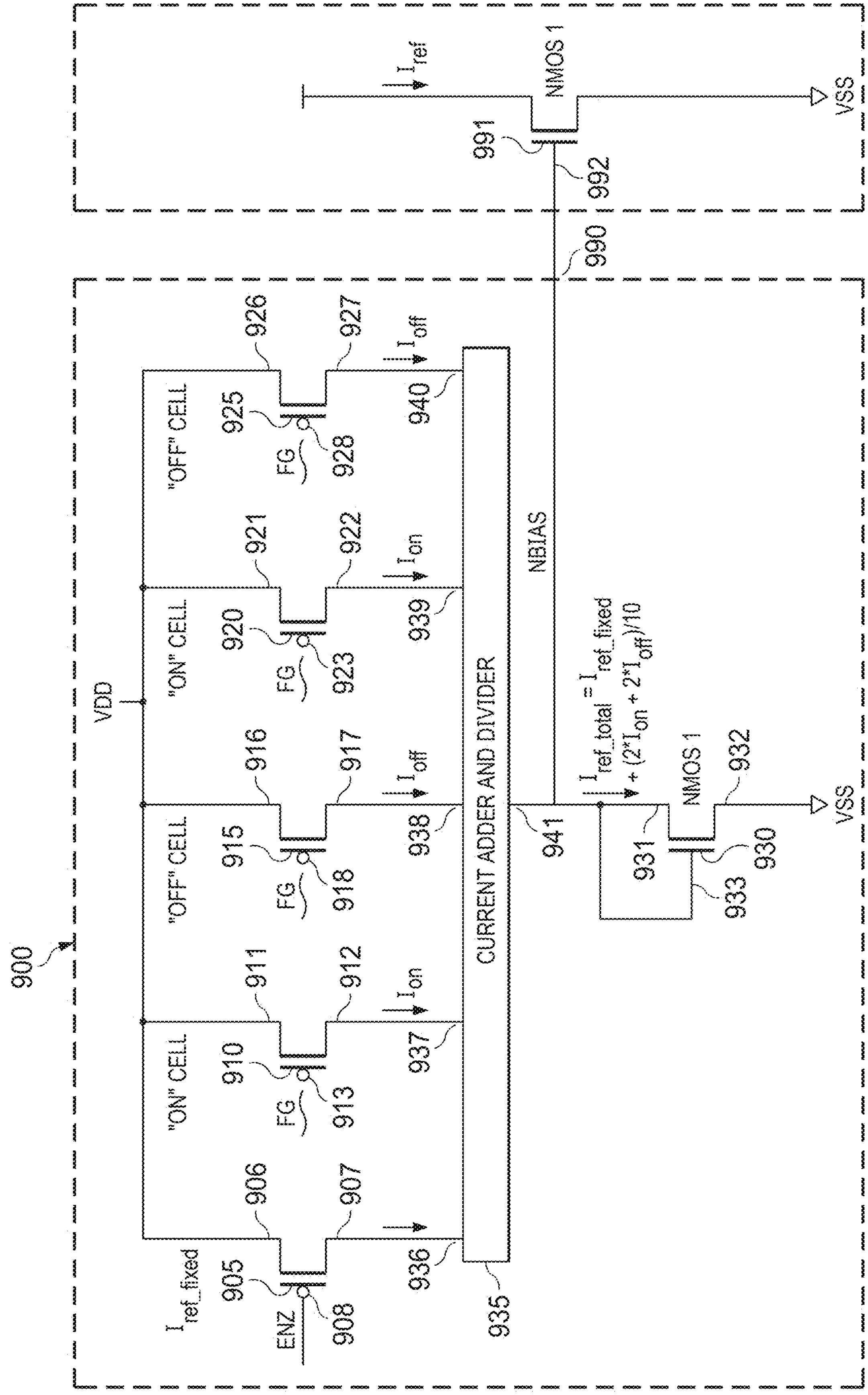
FIG. 9 illustrates a circuit diagram of a third example reference current generator that generates a reference current for a row of a memory array via combining a fixed reference current with on and off currents of bit cells that are cycled with the bit cells of that row.

In various examples, a reference current generator generates a reference current via various techniques. FIGS. 7-9 show different example circuit diagrams of reference current generators that are employed for generating reference currents. Multiple factors affect the bit cell currents $I_{on}$ and $I_{off}$ of the on and off states, respectively, and different reference current generation techniques account for some or all of these factors. The bit cells (e.g., EEPROM bit cells, flash bit cells, etc.) of the reference current generator can be affected by the number of erase and program cycles throughout the life time, the process corner, erase/program condition, the number of read cycles, the operating power supply voltage and the temperature, negative bias temperature instability (NBTI), positive bias temperature instability (PBTI), aging effects, the floating gate charge loss from beginning of life to end of life, etc.

FIG. 7 shows a circuit diagram of a first example reference current generator 700 configured to generate a fixed reference current for a memory array. Reference current generator 700 can partially account for process corners (e.g., weak, nominal, strong), due to variations in fabrication parameters of reference current generator 700 between different semiconductor dies.

Reference current generator 700 includes PMOSFETs 705 (with terminals 706, 707, and 708), 710 (with terminals 711, 712, and 713), 715 (with terminals 716, 717, and 718), and 720 (with terminals 721, 722, and 723). Reference current generator 700 also includes NMOSFETs 725 (with terminals 726, 727, and 728), 730 (with terminals 731, 732, and 733), and 735 (with terminals 736, 737, and 738), and 740 (with terminals 741, 742, and 743). Additionally, reference current generator 700 includes resistors 745 (with terminals 746 and 747 and resistance R0) and 750 (with terminals 751 and 752 and resistance R1).

Terminal 707 of PMOSFET 705 is coupled to terminal 746 of resistor 745, terminal 717 of PMOSFET 715, and terminal 722 of PMOSFET 720 at voltage VDD. Terminal 706 of PMOSFET 705 is coupled to terminal 747 of resistor 745 and terminal 712 of PMOSFET 710. Terminal 708 of PMOSFET 705 is coupled to terminal 711 of PMOSFET 710 and terminal 751 of resistor 750. Terminal 713 of PMOSFET 710 is coupled with terminals 732 and 731 of NMOSFET 730 and terminal 736 of NMOSFET 735. Terminals 716 and 718 of PMOSFET 715 are coupled with terminal 721 of PMOSFET 720 and terminal 737 of NMOSFET 735. Terminal 723 of PMOSFET 720 is coupled with terminals 741 and 742 of NMOSFET 740, terminal 790 of reference current generator 700, and terminals 792 of current mirror 791, terminal 795 of current mirror 794, and terminal 798 of current mirror 797.

Terminal 726 of NMOSFET 725 is coupled to an enable signal for activation of reference current generator 700. Terminal 727 of NMOSFET 725 is coupled to terminal 752 of resistor 750. Terminal 728 of NMOSFET 725 is coupled to terminal 733 of NMOSFET 730 at source voltage VSS. Terminal 738 of NMOSFET 735 is coupled to terminal 743 of NMOSFET 740, also at source voltage VSS.

Example reference current generator 700 includes terminal 790, which is coupled to terminal 792 of current mirror 791, terminal 795 of current mirror 794, and terminal 798 of current mirror 797, similarly to how reference current generator 688 is coupled to current mirrors 691, 694, and 697 of FIGS. 6A and 6B, and reference current generator 700 is one example of a reference current generator 688 of FIGS. 6A and 6B. The match factor N of reference current generator 700 depends on the value of $I_{ref\_total}$, and the $I_{ref}$ to be provided to the bit cells of coupled differential sense amplifiers.

FIG. 8 shows a circuit diagram of a second example reference current generator 800 that generates a reference current for a memory array via on and off currents from a separate mini array of bit cells. Reference current generator 800 can account for process corners (e.g., weak, nominal, strong) and operating voltage and can partially account for process parameter changes from beginning of life (BOL) to end of life (EOL) of the memory circuit, such as NBTI, PBTI, aging effects, etc.

Reference current generator 800 includes FG transistors 805 (with terminals 806 and 807 and FG 808), 810 (with terminals 811 and 812 and FG 813), 815 (with terminals 816 and 817 and FG 818), 820 (with terminals 821 and 822 and FG 823), 825 (with terminals 826 and 827 and FG 828), 830 (with terminals 831 and 832 and FG 833), 835 (with terminals 836 and 837 and FG 838), and 840 (with terminals 841 and 842 and FG 843). Reference current generator 800 also includes NMOSFET 845 with terminals 846, 847, and 848. One half of the FG transistors (e.g., FG transistors 805, 810, 815, and 820) are programmed as "on" cells with a first binary value (e.g., '1') and the other half of the FG transistors (e.g., FG transistors 825, 830, 835, and 840) are programmed as "off" cells with a second binary value (e.g., '0').

Terminal 806 of FG transistor 805, terminal 811 of FG transistor 810, terminal 816 of FG transistor 815, and terminal 821 of FG transistor 820 are coupled to each other at voltage VDD. Terminal 826 of FG transistor 825, terminal 831 of FG transistor 830, terminal 836 of FG transistor 835, and terminal 841 of FG transistor 840 are also coupled to each other at drain voltage VDD.

Terminal 807 of FG transistor 805, terminal 812 of FG transistor 810, terminal 817 of FG transistor 815, terminal 822 of FG transistor 820, terminal 827 of FG transistor 825, terminal 832 of FG transistor 830, terminal 837 of FG transistor 835, terminal 842 of FG transistor 840, and terminals 846 and 848 of NMOSFET 845 are coupled to each other and to terminal 890 of reference current generator 800. Terminal 847 of NMOSFET 845 is at source voltage VSS. Terminal 890 of reference current generator 800 is coupled to terminal 892 of current mirror 891, terminal 895 of current mirror 894, and terminal 898 of current mirror 897, similarly to how reference current generator 688 is coupled to current mirrors 691, 694, and 697 of FIGS. 6A and 6B, and reference current generator 800 is one example of a reference current generator 688 of FIGS. 6A and 6B. The matching factor of the reference current generator 800 is based on the total number of FG transistors used as reference cells, which in example reference current generator 800 is 8.

FIG. 9 shows a circuit diagram of a third example reference current generator 900 that generates a reference current for a row of a memory array via combining a fixed reference current with on and off currents of bit cells (e.g., differential bit cells, etc.) that are cycled with the bit cells of that row. Reference current generator 900 can account for process corners (e.g., weak, nominal, strong); erase and program time, voltage, and temperature; erase and program cycles over the lifetime; read cycles over the lifetime; operating voltage; and process parameter changes from beginning of life (BOL) to end of life (EOL) of the memory circuit, such as NBTI, PBTI, aging effects, etc.

Reference current generator 900 includes PMOSFET 905 (with terminals 906, 907, 908), FG transistor 910 (with terminals 911 and 912 and FG 913), FG transistor 915 (with terminals 916 and 917 and FG 918), FG transistor 920 (with terminals 921 and 922 and FG 923), FG transistor 925 (with terminals 926 and 927 and FG 928), and NMOSFET 930 (with terminals 931, 932, and 933). Reference current generator 900 also includes current adder and divider 935 (with terminals 936, 937, 938, 939, 940, and 941).

Reference current generator 900 generates a reference current $I_{ref}$ for a single row of a memory array (e.g., memory array 110 of FIG. 1, memory array 205 of FIG. 2, etc.), and similar structure is useable for other rows of a memory array (using currents from different FG transistors in place of FG transistors 910, 915, 920, and 925).

One half of the FG transistors (e.g., FG transistors 910 and 920) are programmed with a first binary value (e.g., '1' or '0') and the other half of the FG transistors (e.g., FG transistors 915 and 925) are programmed with a second binary value. When the bit cells of the row for which reference current generator 900 generates a reference current $I_{ref}$ are programmed, the FG transistors 910, 915, 920, and 925 are programmed to opposite values from their current values.

Terminal 906 of PMOSFET 905, terminal 911 of FG transistor 910, terminal 916 of FG transistor 915, terminal 921 of FG transistor 920, and terminal 926 of FG transistor 925 are coupled to each other at voltage VDD. Terminal 907 of PMOSFET 905 is coupled to terminal 936 of current adder and divider 935. Terminal 908 of PMOSFET 905 is coupled to an enable signal for the fixed reference current from PMOSFET 905. Terminal 912 of FG transistor 910 is coupled to terminal 937 of current adder and divider 935. Terminal 917 of FG transistor 915 is coupled to terminal 938 of current adder and divider 935. Terminal 922 of FG transistor 920 is coupled to terminal 939 of current adder and divider 935. Terminal 927 of FG transistor 925 is coupled to terminal 940 of current adder and divider 935.

Terminal 941 of current adder and divider 935 is coupled to terminals 931 and 933 of NMOSFET 930 and to terminal 990 of reference current generator 900. Terminal 932 of NMOSFET 930 is at source voltage VSS. Terminal 990 of reference current generator 900 is coupled to terminal 992 of current mirror 991, terminal 895 of current mirror 894, and terminal 898 of current mirror 897, similarly to how reference current generator 688 is coupled to current mirror 691 of FIGS. 6A and 6B, and reference current generator 900 is one example of a reference current generator 688 of FIGS. 6A and 6B.

Reference current generator 900 is configured to track bit array cell current for a large range of variation of bit cell current by including a set of reference bit cells in each row of the memory array for generating the reference current for that row, providing a self-tracking capability. Because of this tracking capability, reference current generator 900 can be used for read operations over the lifetime of the memory. The $I_{on}$ and $I_{off}$ currents of the reference bit cells of the row closely track the $I_{on}$ and $I_{off}$ currents of the single-ended bit cells of the row by cycling along with the single-ended bit cells of the row. The current of the reference bit cells changes along with the changes to the current of the single-ended bit cells, providing an accurate reference current between $I_{on}$ and $I_{off}$ to the sense amplifier for correct sensing. As a result, this reference current remains useable throughout the lifetime of the memory array.

Figure 10:
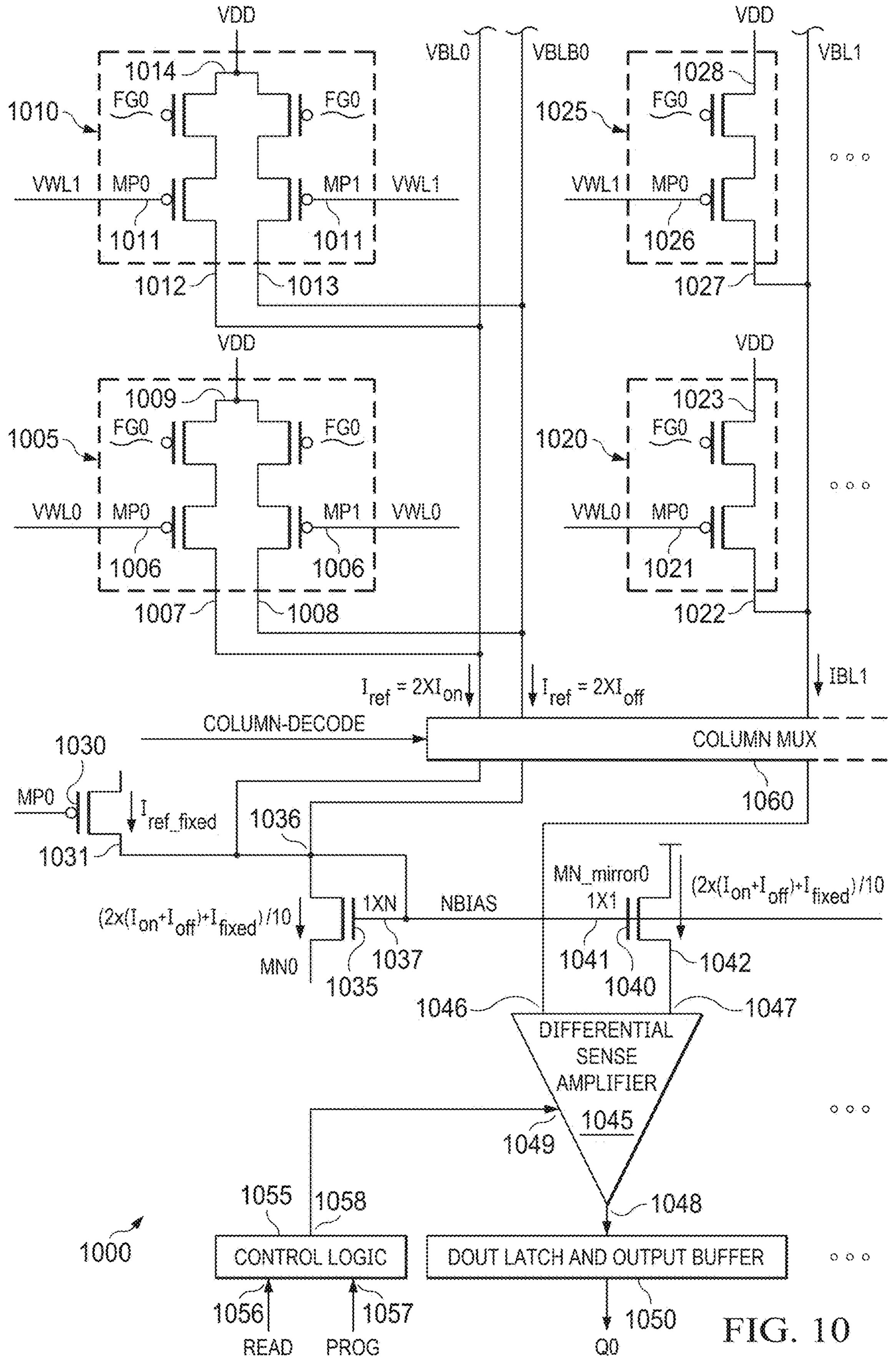
FIG. 10 illustrates a portion of a memory circuit that includes differential bit cells for generation of a reference current for single-ended bit cells of the same row.

FIG. 10 shows a portion of a memory circuit 1000 that includes differential bit cells (e.g., differential bit cells 1005 and 1010) for generation of a reference current for single-ended bit cells (e.g., single-ended bit cells 1020 and 1025) of the same row.

Differential bit cell 1005 includes floating gate transistors FG0 and FG1 with drains coupled at terminal 1009 to a voltage VDD and sources coupled to the drains of PMOSFETs MP0 and MP1, respectively, of differential bit cell 1005. Reference bit cell 1010 includes floating gate transistors FG0 and FG1 with drains coupled at terminal 1014 to voltage VDD and sources coupled to the drains of PMOSFETs MP0 and MP1, respectively, of differential bit cell 1010. The gates of PMOSFETs MP0 and MP1 of reference bit cell 1005 are connected via terminal 1006 to wordline 0 providing voltage VWL0, and the gates of PMOSFETs MP0 and MP1 of reference bit cell 1010 are connected via terminal 1011 to wordline 1 providing voltage VWL1. The sources of the MP0s of the reference bit cells 1005 and 1010 are coupled via terminals 1007 and 1012, respectively, via bitline 0 at voltage VBL0 to terminal 1031 of PMOSFET 1030 (outputting a fixed reference current $I_{ref}$ fixed), terminal 1037 of NMOSFET 1035 and terminal 1041 of NMOSFET current mirror 1040. The sources of the MP1s of the reference bit cells 1005 and 1010 are coupled via terminals 1008 and 1013, respectively, via bitline $\overline{0}$ (0 bar) at voltage VBLB0 to terminal 1036 of NMOSFET 1035.

Single-ended bit cell 1020 and single-ended bit cell 1025 both include a single floating gate transistor (labeled FG0) with a drain coupled at terminal 1023 or 1028, respectively to a voltage VDD and a source coupled to the drain of a p-channel metal oxide semiconductor field effect transistor (PMOSFET, labeled MP0). The gate of PMOSFET MP0 of single-ended bit cells 1020 and 1025 are coupled via wordline terminal 1021 and wordline terminal 1026, respectively to respective wordlines providing voltages VWL0 and VWL1. The sources of the MP0s of the single-ended bit cells 1020 and 1025 are coupled via terminals 1022 and 1027, respectively, via a bitline 1 at voltage VBL1 to terminal 1046 of differential sense amplifier 1045 via column multiplexer 1060.

Input terminal 1047 of differential sense amplifier 1045 is coupled to terminal 1042 of current mirror 1040. Output terminal 1048 of differential sense amplifier 1045 is coupled to Dout latch and output buffer 1050. For example, the Dout latch and output buffer 1050 can be implemented as the latches 140 of FIG. 1, or the array latches 250 of FIG. 2, and/or output buffer of differential sense amplifier 1045. The Dout latch and output buffer 1050 is configured to store the result at the output terminal 1048. Terminal 1049 of differential sense amplifier 1045 is coupled to terminal 1058 of control logic 1055, which provides an appropriate voltage for a selected operation (e.g., read operation, program operation, etc.) based on instructions received by control logic 1055 at terminals 1056 and/or 1057.

Figure 11:
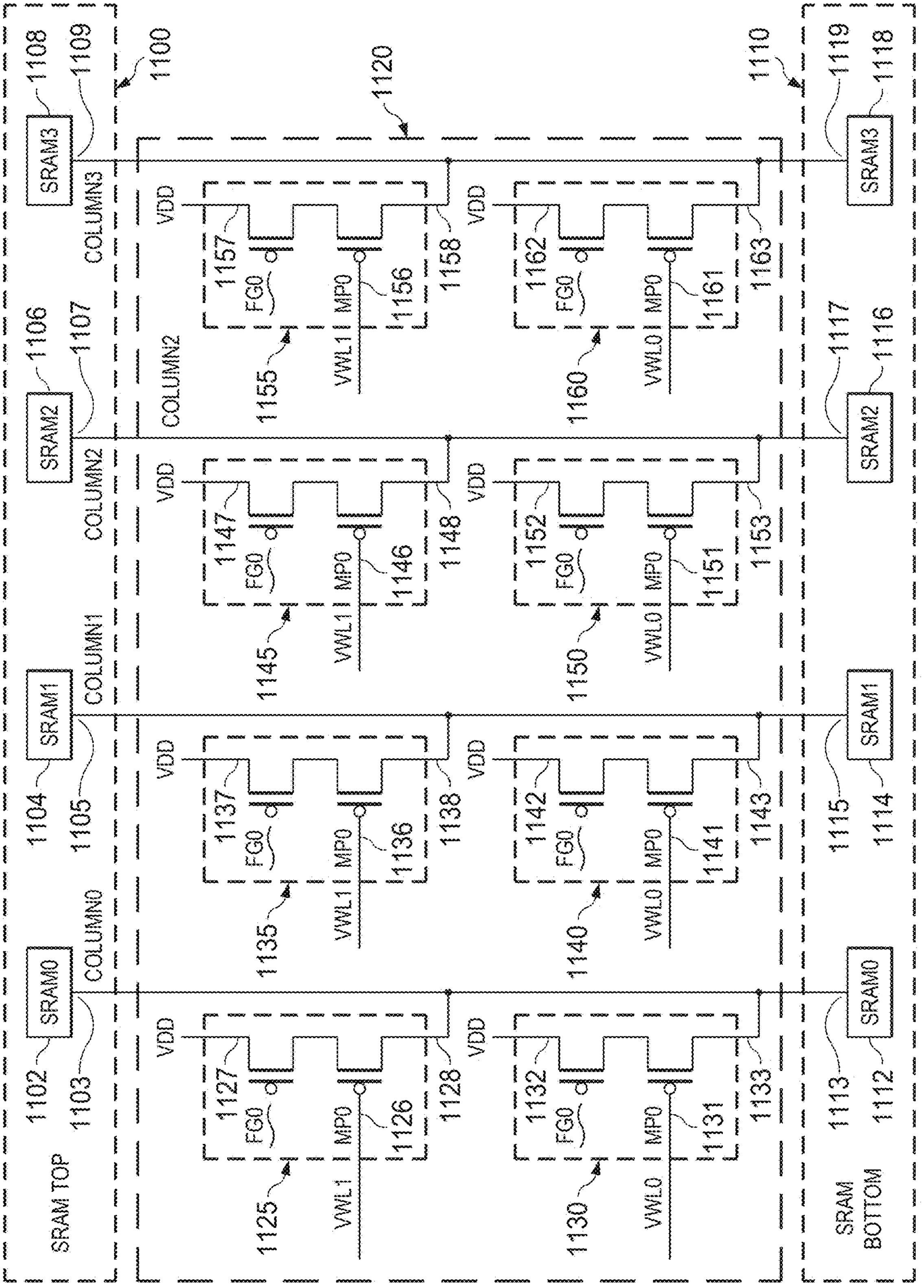
FIG. 11 illustrates a schematic diagram showing an example arrangement of a first set of static random-access memory (SRAM) and a second set of SRAM on opposite sides of a memory array.

Various example circuits (e.g., circuit 100 of FIG. 1 or circuit 200 of FIG. 2, either of which can include a circuit 600 of FIGS. 6A and 6B, which can include a reference current generator 700 of FIG. 7, a reference current generator 800 of FIG. 8, a reference current generator 900 of FIG. 9, etc.) are formed with various arrangements of components. For example, FIG. 11 is a schematic diagram showing an example arrangement of a first set of SRAM 1100 and a second set of SRAM 1110 on opposite sides of a memory array 1120 (for ease of illustration, only two rows and four columns are shown in memory array 1120, but in various examples the memory array has a different number of rows and/or columns). In memory array 1120, single-ended bit cells 1125, 1130, 1135, 1140, 1145, 1150, 1155, 1160 include NMOSFET FG transistors and access transistors, in contrast to the PMOSFET FG transistors and access transistors of FIGS. 3A, 3B, 5, 6, and 8-10. In the various examples described herein, the single-ended bit cells of a memory array include NMOSFET FG transistors and access transistors or include PMOSFET FG transistors and access transistors.

The first set of SRAM 1100 includes SRAM 1102 with terminal 1103 on column 0, SRAM 1104 with terminal 1105 on column 1, SRAM 1106 with terminal 1107 on column 2, and SRAM 1108 with terminal 1109 on column 3.

The second set of SRAM 1110 includes SRAM 1112 with terminal 1113 on column 0, SRAM 1114 with terminal 1115 on column 1, SRAM 1116 with terminal 1117 on column 2, and SRAM 1118 with terminal 1119 on column 3.

Memory array 1120 includes single-ended bit cells 1125 (with terminals 1126, 1127, and 1128) and 1130 (with terminals 1131, 1132, and 1132) on column 0, single-ended bit cells 1135 (with terminals 1136, 1137, and 1138) and 1140 (with terminals 1141, 1142, and 1142) on column 1, single-ended bit cells 1145 (with terminals 1146, 1147, and 1148) and 1150 (with terminals 1151, 1152, and 1152) on column 2, and single-ended bit cells 1155 (with terminals 1156, 1157, and 1158) and 1160 (with terminals 1161, 1162, and 1162) on column 3.

Terminal 1126 of single-ended bit cell 1125, terminal 1136 of single-ended bit cell 1135, terminal 1146 of single-ended bit cell 1145, and terminal 1156 of single-ended bit cell 1155 are coupled to wordline 1 at voltage VWL1. Terminal 1131 of single-ended bit cell 1130, terminal 1141 of single-ended bit cell 1140, terminal 1151 of single-ended bit cell 1150, and terminal 1161 of single-ended bit cell 1160 are coupled to wordline 0 at voltage VWL0.

Terminal 1127 of single-ended bit cell 1125, terminal 1132 of single-ended bit cell 1130, terminal 1137 of single-ended bit cell 1135, terminal 1142 of single-ended bit cell 1140, terminal 1147 of single-ended bit cell 1145, terminal 1152 of single-ended bit cell 1150, terminal 1157 of single-ended bit cell 1155, and terminal 1162 of single-ended bit cell 1160 are coupled to drain voltage VDD.

Terminal 1128 of single-ended bit cell 1125 and terminal 1133 of single-ended bit cell 1130 are coupled to terminal 1103 of SRAM 1102 and terminal 1113 of SRAM 1112. Terminal 1138 of single-ended bit cell 1135 and terminal 1143 of single-ended bit cell 1140 are coupled to terminal 1105 of SRAM 1104 and terminal 1115 of SRAM 1114. Terminal 1148 of single-ended bit cell 1145 and terminal 1153 of single-ended bit cell 1150 are coupled to terminal 1107 of SRAM 1106 and terminal 1117 of SRAM 1116. Terminal 1158 of single-ended bit cell 1155 and terminal 1163 of single-ended bit cell 1160 are coupled to terminal 1109 of SRAM 1108 and terminal 1119 of SRAM 1118.

Figure 12:
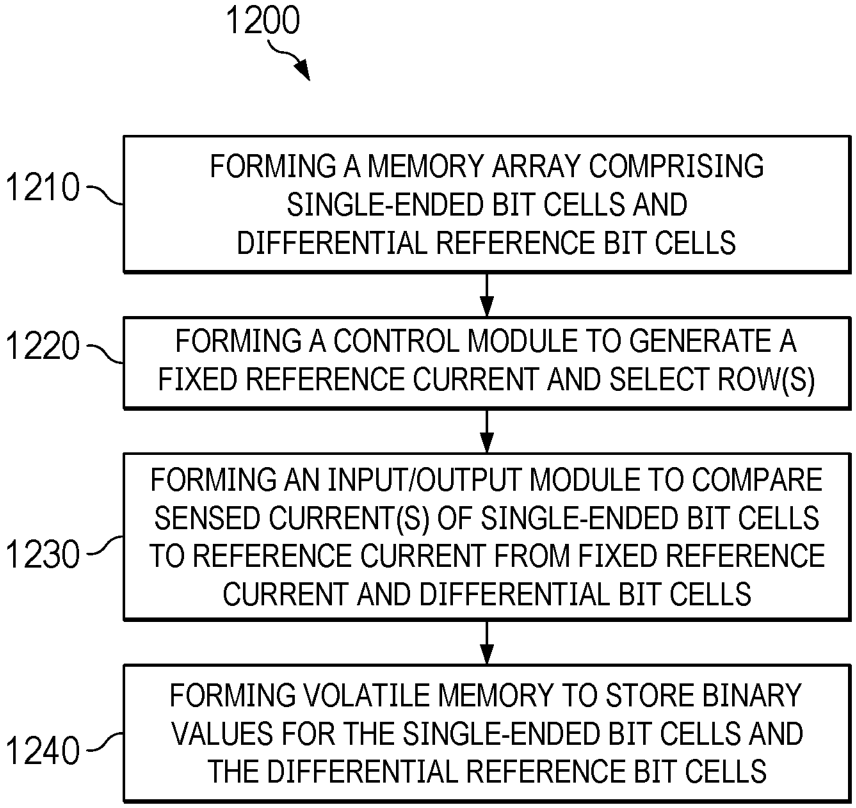
FIG. 12 illustrates an example method for formation of a memory circuit.

FIG. 12 illustrates a method 1200 for formation of a memory circuit, such as the circuit 100 of FIG. 1 or the circuit 200 of FIG. 2.

At 1210, method 1200 includes forming a memory array (e.g., memory array 110 of FIG. 1, memory array 205 of FIG. 2, etc.) that includes memory bit cells arranged in rows and columns. An even number of columns (e.g., 2n columns, where n is a positive integer) include differential bit cells (e.g., reference bit cells 114 of FIG. 1, reference bit cells 215 of FIG. 2, etc.) for use as reference bit cells (e.g., with one half (e.g., n) configured to store a first binary value and another half (e.g., n) configured to store a second binary value to facilitate generation of reference currents for rows) and the other columns (e.g., the majority of columns) include single-ended bit cells (e.g., single-ended bit cells 112 of FIG. 1, single-ended bit cells 210 of FIG. 2, etc.) for use as data cells, error correction, etc. Thus, each row of the memory array formed includes an even number of differential bit cells along with single-ended bit cells.

At 1220, method 1200 includes forming a control module (e.g., control module 120 of FIG. 1, control module 220 of FIG. 2, etc.) that includes a set of wordline drivers (e.g., wordline drivers of control module 120 of FIG. 1, wordline drivers 225 of FIG. 2, etc.) and a reference current generator (e.g., reference current generator 688 of FIGS. 6A and 6B, reference current generator 700 of FIG. 7, reference current generator 800 of FIG. 8, reference current generator 900 of FIG. 9, etc.). The set of wordlines are coupled to rows of the memory array (e.g., memory array 110 of FIG. 1, memory array 205 of FIG. 2, etc.) for selection of rows for operations on the memory array. The reference current generator is configured to generate a fixed reference current and reference currents specific to individual rows via a current adder and divider (e.g., current adder and divider 935 of FIG. 9, etc.) that combines the fixed reference current with currents of the reference bit cells of the individual rows and divides the resulting current to generate the reference current specific to that individual row.

At 1230, method 1200 includes forming an I/O module (e.g., I/O module 130 of FIG. 1, I/O module 260 of FIG. 2, etc.) that includes a column multiplexer (e.g., column multiplexer 580 of FIGS. 5A and 5B, column multiplexer 680 of FIGS. 6A and 6B, column multiplexer 1060 of FIG. 10, etc.) for selection of columns, a first set of differential sense amplifiers (e.g., differential sense amplifier 380 of FIG. 3B, etc.), and a second set of differential sense amplifiers (e.g., differential sense amplifier 330 of FIG. 3A; differential sense amplifiers 509, 522, and/or 535 of FIGS. 5A and 5B; differential sense amplifiers 609, 622, and/or 635 of FIGS. 6A and 6B; differential sense amplifier 1045 of FIG. 10; etc.). The first set of differential sense amplifiers are coupled to outputs of the reference bit cells for reading the reference bit cells (e.g., reference bit cells 114 of FIG. 1, reference bit cells 215 of FIG. 2, etc.) and to the control module (e.g., control module 120 of FIG. 1, control module 220 of FIG. 2, etc.) for generation of row-specific reference currents. The second set of differential sense amplifiers are coupled to outputs of the single-ended bit cells (e.g., single-ended bit cells 112 of FIG. 1, single-ended bit cells 210 of FIG. 2, etc.) and reference current generator for reading the single-ended bit cells.

At 1240, method 1200 includes forming a set of volatile memory (e.g., latches 140 of FIG. 1, latches 270 of FIG. 2, etc.) coupled to the control module and/or a latch control circuit (e.g., latch control circuit 235 of FIG. 2, etc.) and configured to store data values to be programmed to rows of the memory array, such as program values for single-ended bit cells and opposite values (e.g., a first binary value or a second binary value, etc.) to values read from reference bit cells (e.g., a second binary value or a first binary value, respectively, etc.) for programming to the reference bit cells.

While, for purposes of simplicity of explanation, the example method of FIG. 12 is shown and described as executing serially, it is to be understood and appreciated that the example method of FIG. 12 is not limited by the illustrated order, as some actions could in other examples occur in different orders, multiple times and/or concurrently from that shown and described herein. Moreover, it is not necessary that all described actions be performed to implement a method.

In this description, unless otherwise stated, "about," "approximately" or "substantially" preceding a parameter means being within +/−10 percent of that parameter. Modifications are possible in the described embodiments, and other embodiments are possible, within the scope of the claims.

In this description, the term "couple" can cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

In this description, a device that is "configured to" perform a task or function can be configured (e.g., programmed and/or hardwired) at a time of manufacturing by a manufacturer to perform the function and/or can be configurable (or reconfigurable) by a user after manufacturing to perform the function and/or other additional or alternative functions. The configuring can be through firmware and/or software programming of the device, through a construction and/or layout of hardware components and interconnections of the device, or a combination thereof. Furthermore, a circuit or device that is described herein as including certain components can instead be configured to couple to those components to form the described circuitry or device. For example, a structure described herein as including one or more semiconductor elements (such as transistors), one or more passive elements (such as resistors, capacitors, and/or inductors), and/or one or more sources (such as voltage and/or current sources) can instead include only the semiconductor elements within a single physical device (e.g., a semiconductor die and/or integrated circuit (IC) package) and can be configured to couple to at least some of the passive elements and/or the sources to form the described structure, either at a time of manufacture or after a time of manufacture, such as by an end-user and/or a third-party.

The phrase "based on" means "based at least in part on". Therefore, if X is based on Y, X can be a function of Y and any number of other factors.

Modifications are possible in the described embodiments, and other embodiments are possible, within the scope of the claims.

What is claimed is:

1. A circuit, comprising:

a memory array comprising memory bit cells arranged in rows and columns, wherein a given row of the rows comprises reference bit cells and single-ended bit cells, the reference bit cells being differential bit cells, and the reference bit cells comprise a first set of reference bit cells configured to store a first binary value and a second set of reference bit cells configured to store a second binary value that is different from the first binary value;

a control module configured to generate a first reference current and to select the given row for a read operation; and an input/output module configured to compare a sensed current of a respective single-ended bit cell of the single-ended bit cells for the read operation to a second reference current, wherein the second reference current is based on the first reference current and respective currents of the first set of reference bit cells and the second set of reference bit cells.

2. The circuit of claim 1, wherein the first set of reference bit cells comprises n reference bit cells, the second set of reference bit cells comprises n reference bit cells, and n is an integer greater than 1.

3. The circuit of claim 2, wherein the second reference current is a total reference current divided by 2n+1, wherein the total reference current is a sum of the first reference current and the respective currents of the first set of reference bit cells and the second set of reference bit cells.

4. The circuit of claim 1, further comprising volatile memory (VM) configured to store the second binary value for the first set of reference bit cells and the first binary value for the second set of reference bit cells responsive to the read operation.

5. The circuit of claim 4, wherein the control module is further configured to select the given row for a program operation, and wherein the VM is configured to store program values for the single-ended bit cells as part of the program operation.

6. The circuit of claim 5, wherein, in connection with the program operation, the VM is configured to program the first set of reference bit cells to store the second binary value and the second set of reference bit cells to store the first binary value.

7. The circuit of claim 5, wherein the VM is static random-access memory (SRAM) bit cells.

8. The circuit of claim 5, wherein the VM comprises a first portion of the VM and a second portion of the VM, and the memory array is arranged between the first portion of the VM and the second portion of the VM.

9. The circuit of claim 5, wherein the given row is a first row, the reference bit cells are first reference bit cells, the single-ended bit cells are first single-ended bit cells, and the program values are first program values, wherein the control module is further configured to select a second row for the program operation, the second row comprises second reference bit cells and second single-ended bit cells, the second reference bit cells comprise a third set of reference bit cells configured to store the first binary value and a fourth set of reference bit cells configured to store the second binary value, and wherein the VM is further configured to store the second binary value for the third set of reference bit cells and the first binary value for the fourth set of reference bit cells in connection with the read operation, and the VM is further configured to store second program values for the second single-ended bit cells in connection with the program operation.

10. The circuit of claim 1, wherein the single-ended bit cells comprise data bit cells and error correction bit cells.

11. The circuit of claim 1, wherein the single-ended bit cells comprise one of electrically erasable programmable read-only memory (EEPROM), flash memory, or one-time programmable (OTP) memory.

12. An integrated circuit, comprising:

a memory array comprising memory bit cells arranged in rows and columns, wherein a given row of the rows comprises differential reference bit cells and single-ended bit cells, the differential reference bit cells of the given row have a first input, and the single-ended bit cells of the given row have a second input;

a set of wordline drivers, wherein a given wordline driver of the set of wordline drivers has an output coupled to the first input and to the second input;

a control circuit comprising a row/column decoder having first control outputs, wherein each of the first control outputs are coupled to a respective wordline driver of the set of wordline drivers;

first differential sense amplifiers, wherein outputs of a given differential reference bit cell of the differential reference bit cells are coupled to inputs of a given differential sense amplifier of the first differential sense amplifiers; and second differential sense amplifiers, wherein an output of a given single-ended bit cell of the single-ended bit cells is coupled to an amplifier input of a given differential sense amplifier of the second differential sense amplifiers.

13. The integrated circuit of claim 12, further comprising a set of current mirrors, wherein the amplifier input of the given differential sense amplifier of the second differential sense amplifiers is a first amplifier input of the given differential sense amplifier of the second differential sense amplifiers, and a given current mirror of the set of current mirrors has an output coupled to a second amplifier input of the given differential sense amplifier of the second differential sense amplifiers.

14. The integrated circuit of claim 13, wherein an input of the given current mirror is coupled to an output of a current adder and divider circuit having a first input and second inputs, wherein the first input of the current adder and divider circuit is coupled to a reference output of the control circuit, and an output of the given differential sense amplifier of the first differential sense amplifiers is coupled with a given second input of the second inputs of the current adder and divider circuit.

15. The integrated circuit of claim 12, further comprising volatile memory (VM) coupled to outputs of the first differential sense amplifiers and coupled to outputs of the second differential sense amplifiers.

16. The integrated circuit of claim 15, wherein the VM is static random-access memory (SRAM) bit cells.

17. The integrated circuit of claim 15, wherein the VM comprises a first portion of the VM and a second portion of the VM, and the memory array is arranged between the first portion of the VM and the second portion of the VM.

18. A method of forming a circuit, comprising:

forming a memory array comprising memory bit cells arranged in rows and columns, a given row of the rows comprises reference bit cells and single-ended bit cells, the reference bit cells are differential bit cells, and the reference bit cells comprise a first set of reference bit cells configured to store a first binary value and a second set of reference bit cells configured to store a second binary value that is different from the first binary value;

forming a control module configured to generate a first reference current and to select the given row for a read operation; and forming an input/output module configured to compare a sensed current of a respective single-ended bit cell of the single-ended bit cells for the read operation to a second reference current, wherein the second reference current is based on the first reference current and respective currents of the first set of reference bit cells and the second set of reference bit cells.

19. The method of claim 18, wherein the first set of reference bit cells comprises n reference bit cells, the second set of reference bit cells comprises n reference bit cells, and n is an integer greater than 1.

20. The method of claim 19, wherein the second reference current is a total reference current divided by 2n+1, wherein the total reference current is a sum of the first reference current and the respective currents of the first set of reference bit cells and the second set of reference bit cells.

21. The method of claim 18, further comprising forming a volatile memory (VM), wherein the VM is configured to store the second binary value for the first set of reference bit cells and the first binary value for the second set of reference bit cells responsive to the read operation.

* * * * *